United States Patent [19]

Gaillard

[11] 4,383,228

[45] May 10, 1983

[54] FILTER DEVICE COMPRISING SWITCHED-CAPACITANCE INTEGRATING NETWORKS

[75] Inventor: Jean Gaillard, Verrieres-le-Buisson, France

[73] Assignee: Telecommunications Radioelectriques et Telephoniques T.R.T., Paris, France

[21] Appl. No.: 214,603

[22] Filed: Dec. 9, 1980

[30] Foreign Application Priority Data

Dec. 12, 1979 [FR] France ................................. 79 30495

[51] Int. Cl.³ ..................... H03H 11/12; H03H 19/00
[52] U.S. Cl. .................................... 333/173; 307/521; 307/353; 333/19
[58] Field of Search .......................... 333/173, 167, 19; 328/167, 151; 307/352–353, 520–523

[56] References Cited

FOREIGN PATENT DOCUMENTS 2840346 11/1979 Fed. Rep. of Germany ...... 333/173

*Primary Examiner*—Marvin L. Nussbaum
*Attorney, Agent, or Firm*—Robert J. Kraus

[57] ABSTRACT

High-pass, low-pass and band-pass filters are obtained by combining switched-capacitance integrating networks.

5 Claims, 59 Drawing Figures

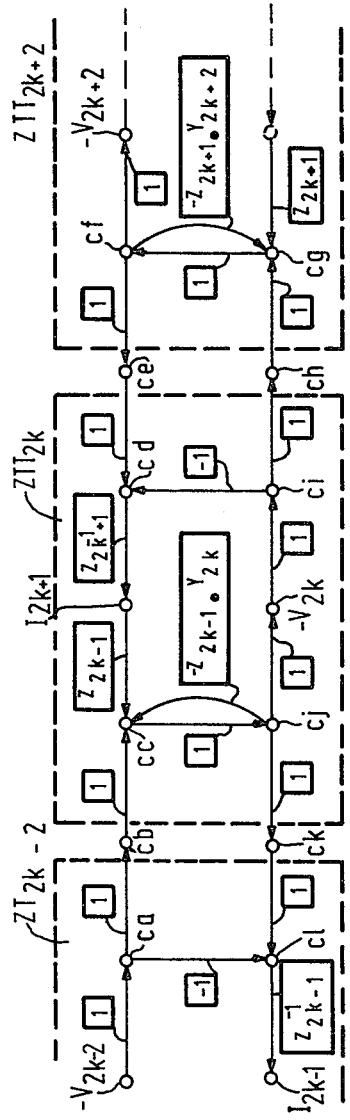
FIG.13
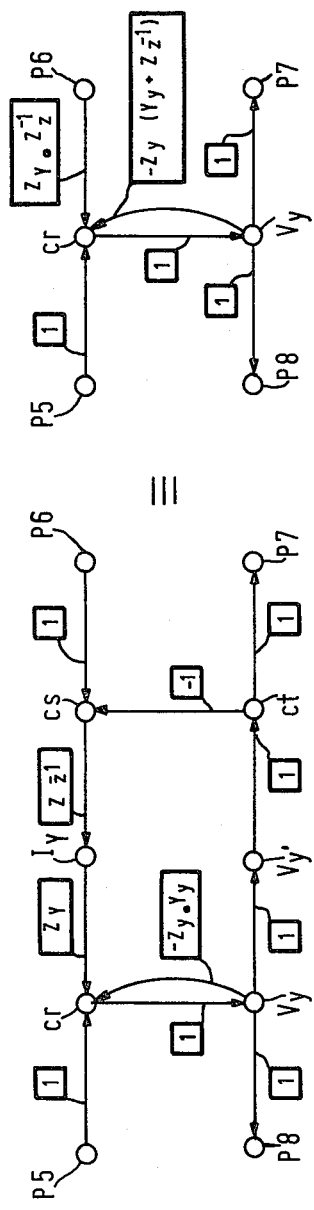
FIG.14b
FIG.14a

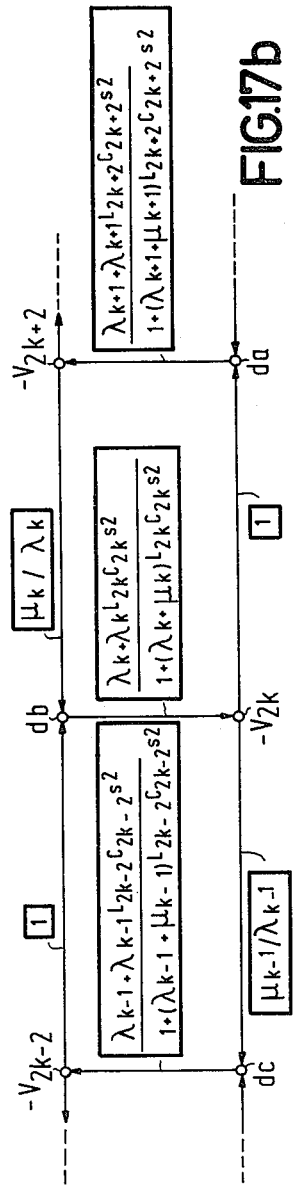
FIG.17b
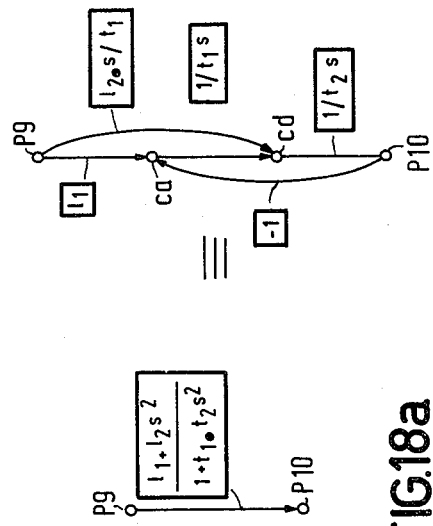
FIG.18b
FIG.18a

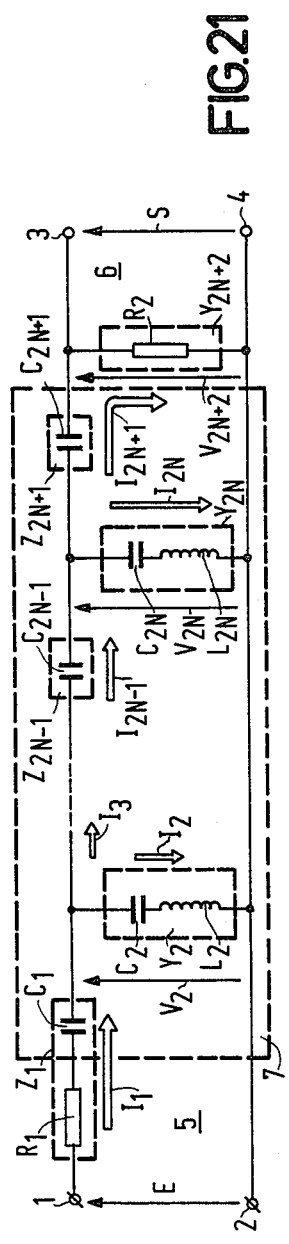
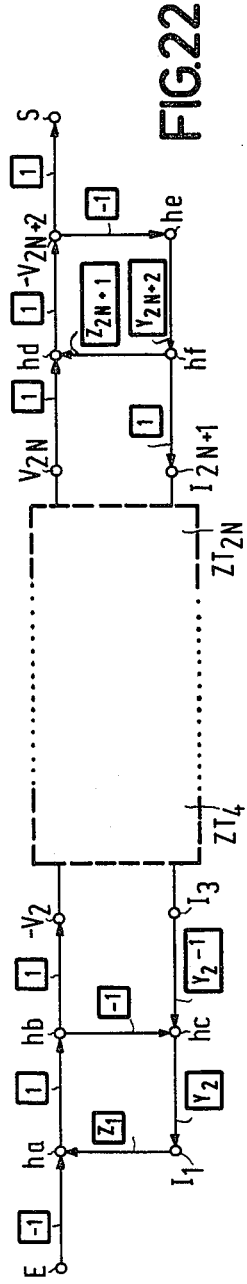
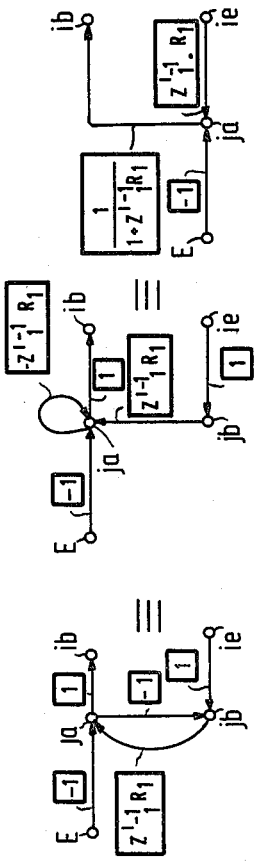
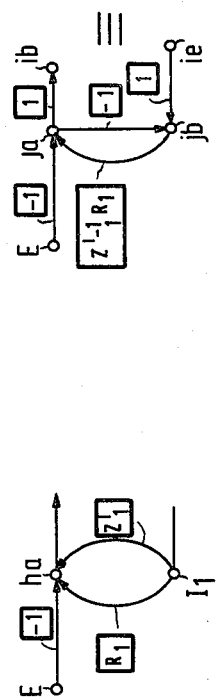
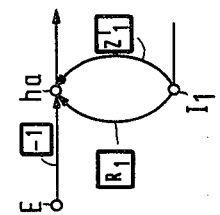

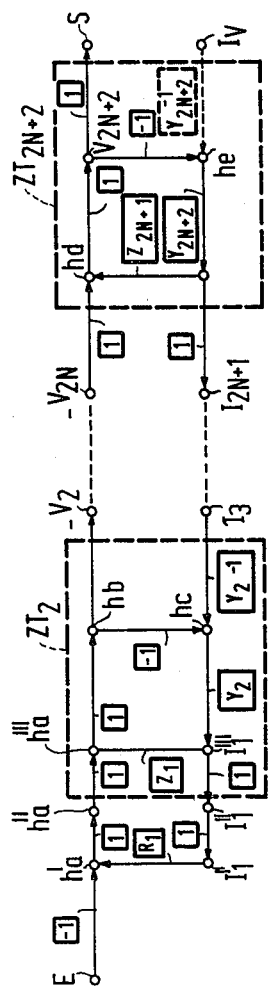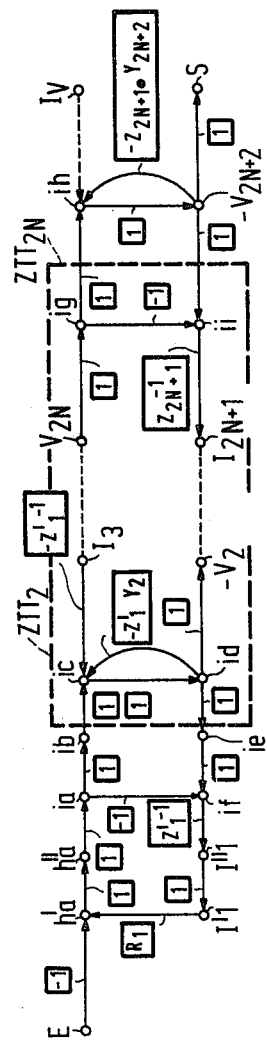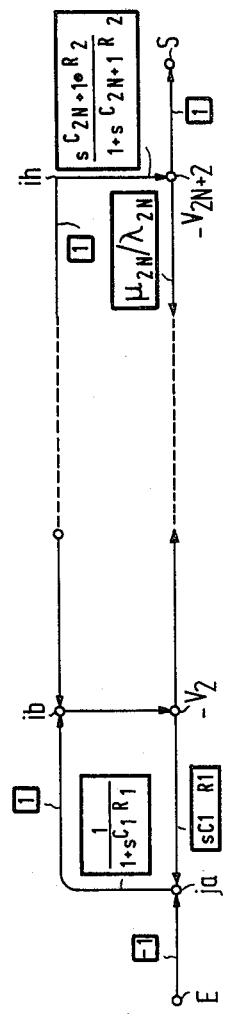

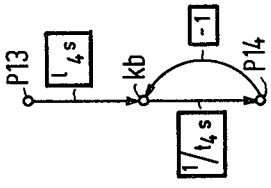
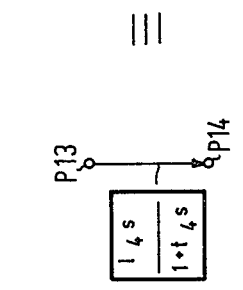
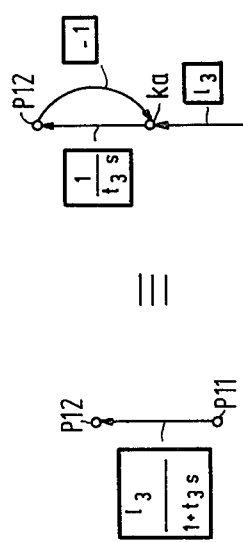
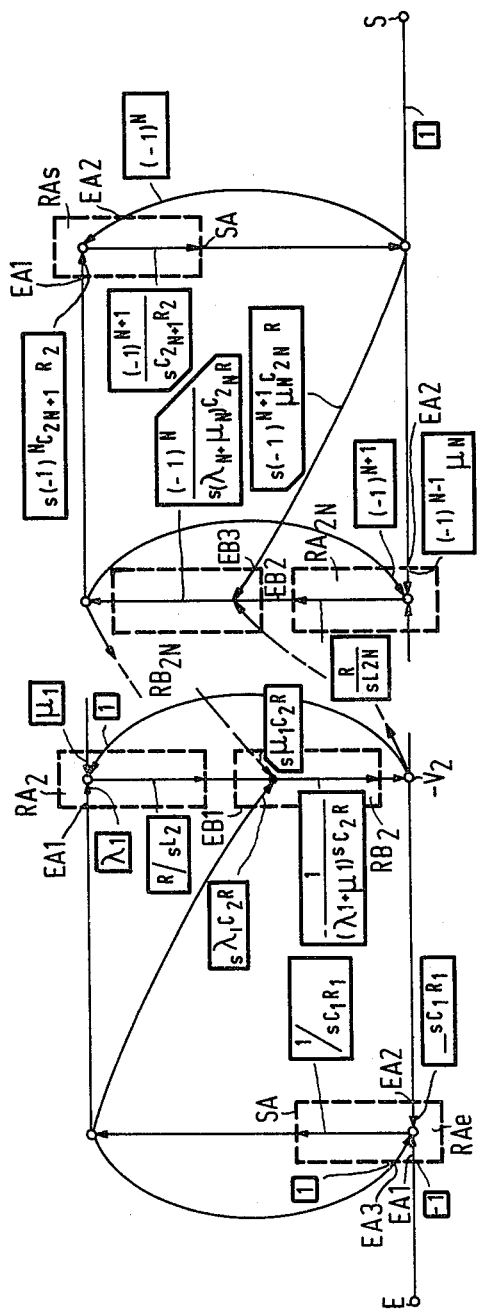

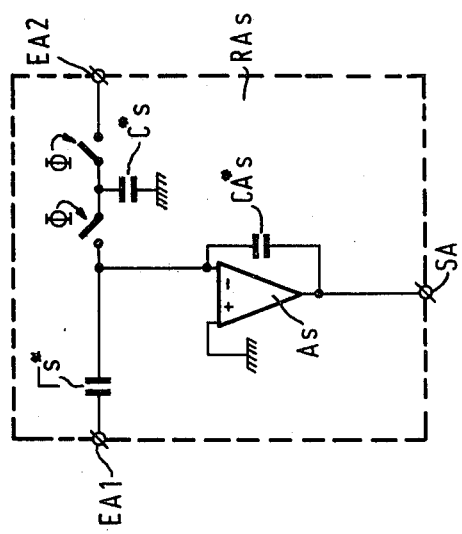
FIG.31.b
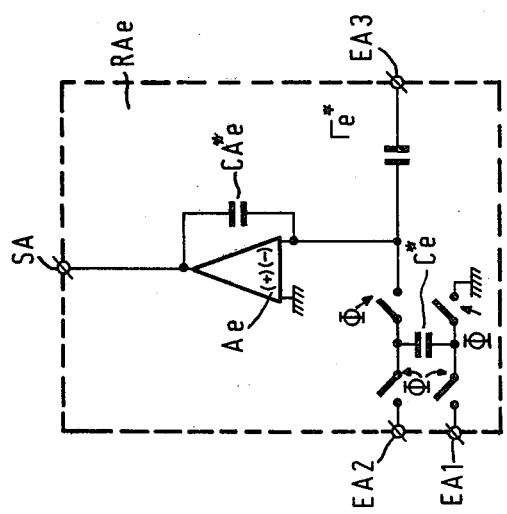
FIG.31.a

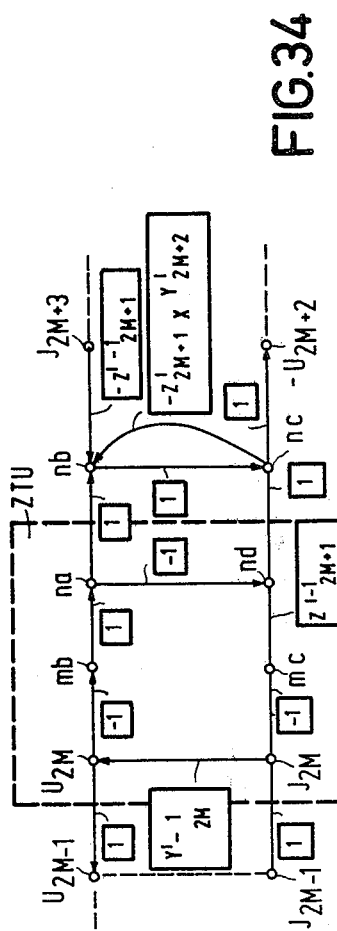
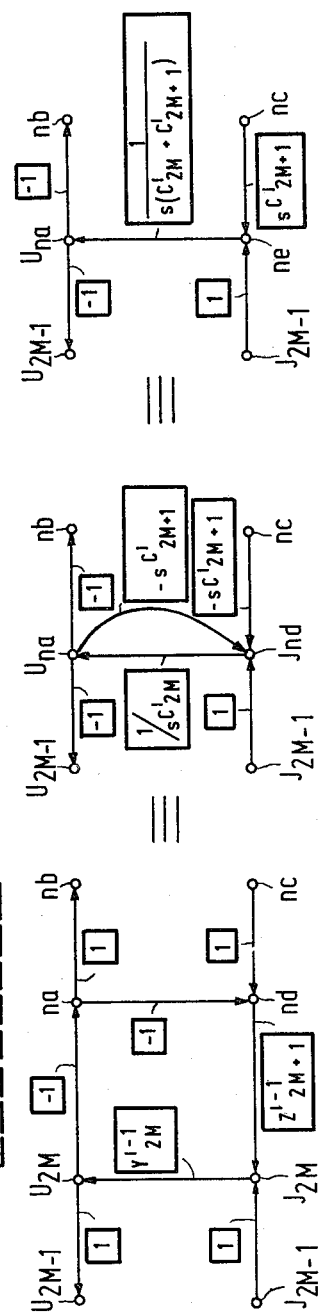
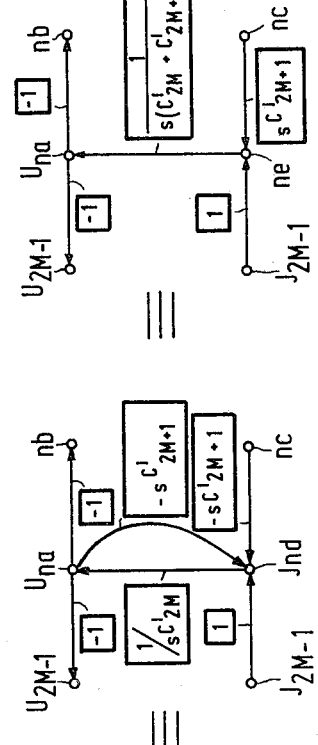
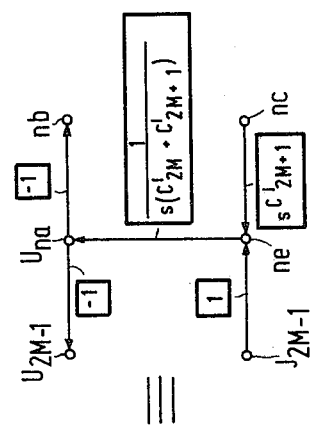
FIG.34
FIG.35a
FIG.35b
FIG.35c

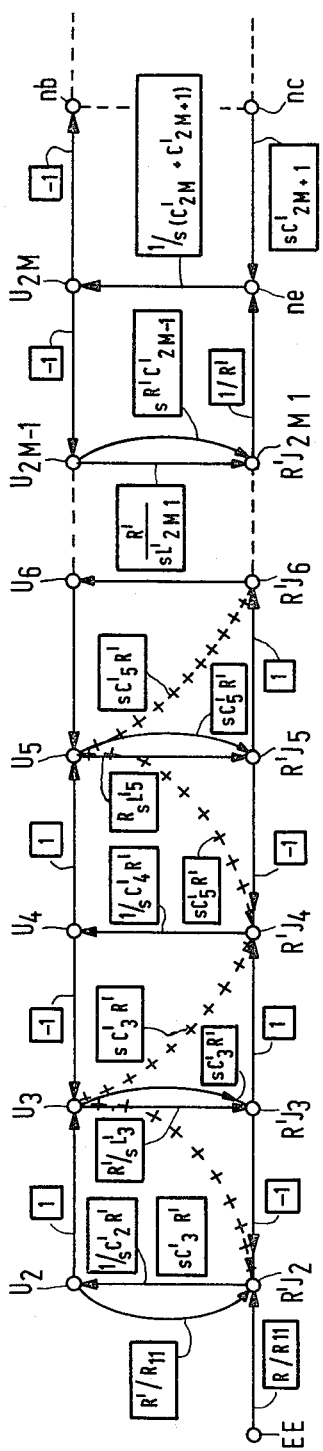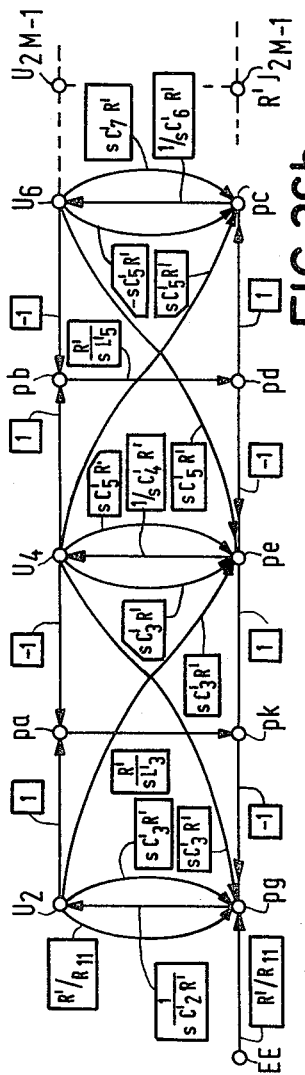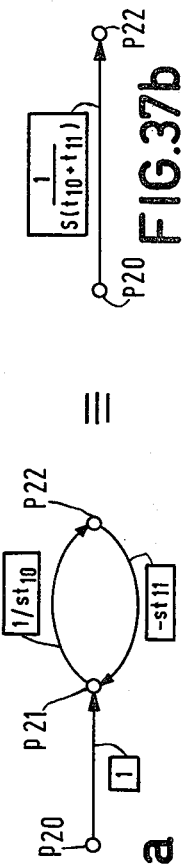
FIG.36a FIG.36b FIG.37a FIG.37b

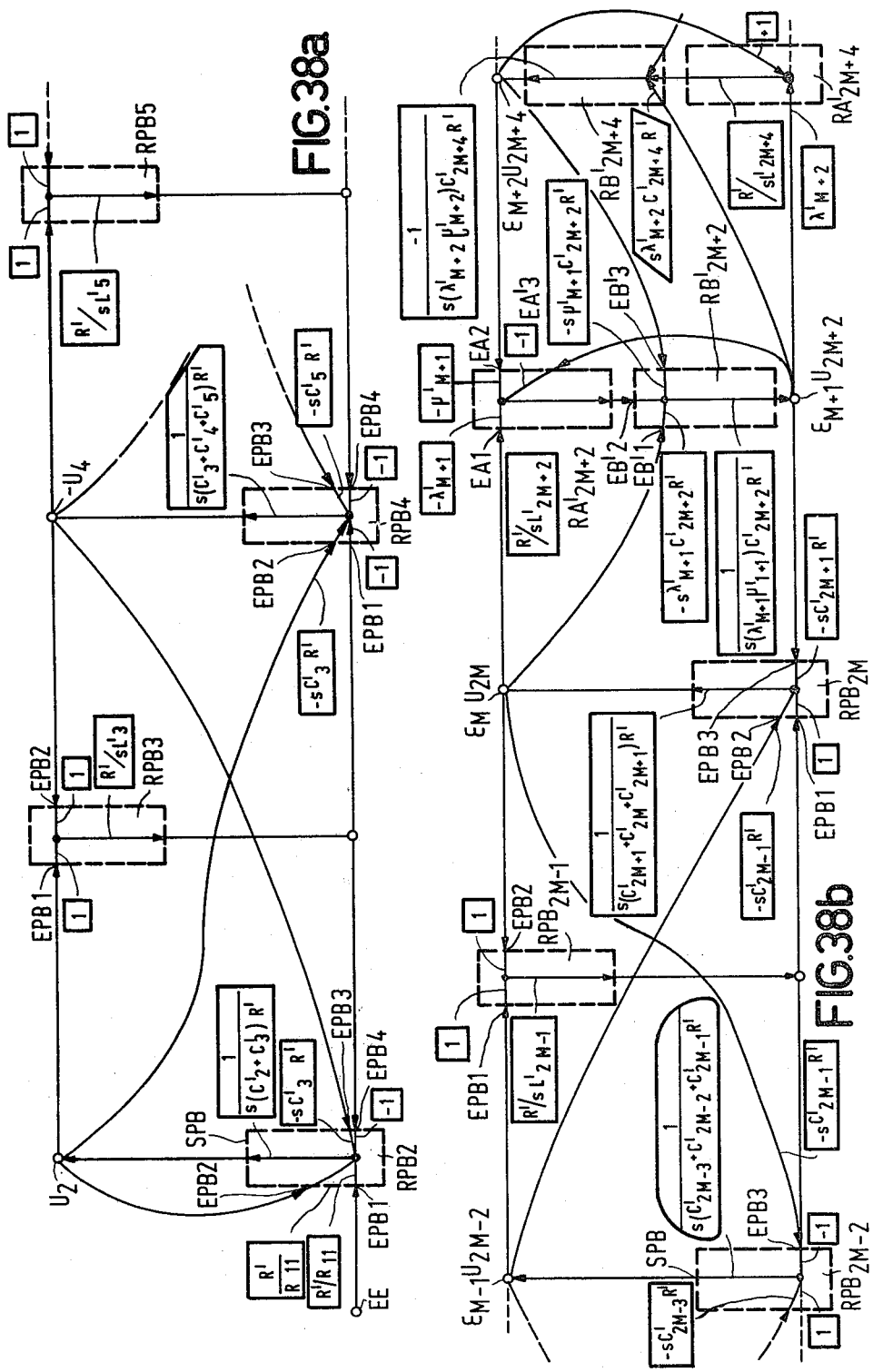

FILTER DEVICE COMPRISING SWITCHED-CAPACITANCE INTEGRATING NETWORKS

BACKGROUND OF THE INVENTION

The invention relates to a filter device comprising switched-capacitance integrating networks, in which a first group of switched-capacitance integrating networks is used for simulating an analog high-pass ladder filter. The analog filter includes a first and a second input terminal, a first and a second output terminal, a plurality of series, connected capacitors . . . , $C_{2k-1}$, $C_{2k+1}$, $C_{2k+3}$, . . . (in which the index k is an integer) interconnecting the first input terminal and the first output terminal, a plurality of admittances . . . $Y_{2k}$, $Y_{2k+2}$, . . . connected between the common electrodes of respective capacitors and the other ends connected to the second input and output terminals via a common line. Each admittance includes an inductor in series with a capacitor.

An important property of ladder filters comprising self-induction coils and loss-free capacitors is that a deviation of the values of these elements from their optimum values gives rise to only a slight degradation of filter characteristics. However, analog filters are expensive to realize, especially because of the presence of the self-induction coils. For realizing such filters it is also possible to employ switched-capacitance integrating networks. The article entitled "Design Techniques for MOS switched Capacitors Ladder Filters," by GORDON M. JACOBS et al, which has appeared in the magazine *IEEE TRANSACTIONS ON CIRCUITS AND SYSTEMS*, Vol. cas-25 no. 12, December 1978, describes filters comprising switched-capacitance integrating networks for simulating an analog ladder filter, but said article only describes how to simulate low-pass filters.

SUMMARY OF THE INVENTION

The present invention proposes a filter structure comprising switched-capacitance integrating networks for simulating a high-pass ladder filter.

The present invention also proposes a filter which provides a band-pass filtration.

To this end a filter of the type mentioned in the opening paragraph is characterized in that the first group is constituted by a plurality of pairs of switched-capacitance integrating networks $RA_{2k}$, $RB_{2k}$, each of which comprises three inputs and one output, the first input of the network $RA_{2k}$ being connected to the output of the network $RB_{2k-2}$, the second input to the output of the network $RB_{2k+2}$, the third input to the output of the network $RB_{2k}$, the first input of the network $RB_{2k}$ being connected to the output of the network $RB_{2k-2}$, the second input to the output of the network $RA_{2k}$ and the third input to the output of the network $RB_{2k+2}$, the network $RA_{2k}$ having the following transfer functions:

between the first input and the output:

$$\frac{(-1)^{k-1}\lambda_k R}{s L_{2k}}$$

between the second input and the output:

$$\frac{(-1)^{k+1}\mu_k R}{s L_{2k}}$$

between the third input and the output:

$$\frac{(-1)^{k+1} R}{s L_{2k}}$$

while the network $RB_{2k}$ has the following transfer functions:

between the first input and the output:

$$-\frac{C_{2k-1}}{C_{2k-1} + C_{2k+1}}$$

between the second input and the output:

$$\frac{(-1)^k (C_{2k-1} + C_{2k} + C_{2k+1})}{s(C_{2k-1} + C_{2k+1}) C_{2k} R}$$

between the third input and the output:

$$-\frac{C_{2k+1}}{C_{2k-1} + C_{2k+1}}$$

in said expressions:

$$\lambda_k = \frac{C_{2k-1}}{C_{2k-1} + C_{2k} + C_{2k+1}} \quad \mu_k = \frac{C_{2k+1}}{C_{2k-1} + C_{2k} + C_{2k+1}}$$

s being the LAPLACE operator, and R an arbitrary constant having the dimensions of a resistance.

It will be noted that in order to realize a high-pass filter of the order $2N+1$ in accordance with the invention $2N+2$ switched-capacitance integrating networks are required.

Moreover, it is to be noted that if the capacitors . . . , $C_{2k}$, . . . are replaced by a short-circuit, this is equivalent to the capacitor having an infinite capacitance. The transfer functions then remain unchanged, but it is to be noted that in this case: $\lambda_k = 0$ and $\xi_k = 0$.

A high-pass filter structure may be combined with a low-pass filter structure in order to obtain a band-pass filtration.

A filter device in accordance with the invention having a band-pass filter characteristic and in which a second group of switched-capacitance integrating networks, employed in order to simulate an analog low-pass ladder-filter structure, is combined with the first group in order to simulate an analog band-pass ladder filter comprising a first and a second output terminal, a plurality of parallel branches respectively having the impedances . . . , $Z'_{2i-1}$, $Z'_{2i+1}$, . . . (where i = 2, . . . , M − 1) which are connected in series in order to interconnect the first input terminal to the first output terminal, a plurality of capacitors $C'_2$ . . . $C'_{2i}$ . . . whose one electrode is connected to the second input and output terminals via a common line, whose other electrode is connected to the first input terminal for the capacitor $C'_{2i}$ at the common points of the parallel branches which have impedances $Z'_{2i-1}$, $Z'_{2i+1}$. Each of the parallel branches comprises a self-induction coil with an inductance $L'_{2i}$ in parallel with a capacitor having a capacitance $C'_{2i}$ in order to obtain an impedance $Z'_{2i}$.

The second group comprises a first plurality of switched-capacitance networks ($RPB_2$, $RPB_4$ ... $RPB_{2M}$) with four inputs and a second plurality ($RPB_3$, $RPB_5$ ... $RPB_{2M-1}$) with two inputs. The first input of a network $RPB_{2i+1}$ is connected to the output of the network $RPB_{2i}$ and the second input is connected to the output of the network $RPB_{2i+2}$. The first input of the network $RPB_{2i}$ is connected to the output of the network $RPB_{2i-1}$, the second input is connected to the output of the network $RPB_{2i-2}$ the third input is connected to the output of the network $RPB_{2i+2}$, and the fourth input is connected to the output of the network $RPB_{2i+1}$. The networks $RPB_{2i+1}$ having the following transfer function:

between the first input and the output, on the one hand and the second input and the output on the other hand:

$$\frac{R'}{sL'_{2i+1}}$$

R' being an arbitrary constant with the units of resistance and s being the LAPLACE operator, while the networks $RPB_{2i}$ have the following transfer functions:

between the first input and the output on the one hand the fourth input and the output on the other hand:

$$-1/s \, (C'_{2i-1} + C'_{2i} + C_{2i+1})$$

between the second input and the output:

$$-\frac{C'_{2i-1}}{C'_{2i-1} + C'_{2i} + C'_{2i+1}}$$

between the third input and the output:

$$-\frac{C'_{2i+1}}{C'_{2i-1} + C'_{2i} + C'_{2i+1}}$$

It is to be noted again that to produce a band-pass filter of the order 2N', in accordance with the invention, 2N' integrating networks are required, each comprising an operational amplifier.

The invention also relates to the case in which the above-mentioned parallel brand does not comprise a capacitor, and thus in the formulas $C'_{2i}=0$.

BRIEF DESCRIPTION OF THE DRAWING

FIG. 13 shows the transformed diagram, whilst moreover zones are indicated to which the transformation shown in FIGS. 14a and 14b is applied.

FIGS. 17a and 17b show the same flow diagrams, but the diagram of FIG. 17b also includes the various transmission factors as a function of the self-inductance and capacitance values.

FIGS. 18a and 18b show a transformation to be applied to the diagram of FIG. 17b.

FIG. 21 represents the circuit diagram of an analog high-pass ladder filter to be realized in accordance with the invention.

FIG. 22 shows a first flow diagram corresponding to the input and output circuits of the circuit diagram of FIG. 21.

FIG. 23 shows the double version of an arc of the diagram of FIG. 22.

FIGS. 24 and 25 represent successive modifications of the diagram of FIG. 22.

FIGS. 26a, 26b, 26c show a transformation applied to the diagram of FIG. 25.

FIG. 27 shows a diagram in which the transmission factors are functions of the self-inductance and capacitance elements indicated in the diagram of FIG. 22.

FIGS. 28a and 28b on the one hand and FIGS. 29a and 29b on the other hand show the transformations applied to the diagram of FIG. 27 in order to obtain the final diagram of FIG. 30. Said diagram of FIG. 30 also shows the structure of the input circuit and the output circuit of the high-pass filter device in accordance with the invention.

FIGS. 31a and 31b show the circuit diagrams of the switched-capacitance integrating networks forming part of the input and output circuits respectively of the filter device represented in the diagram of FIG. 30.

FIG. 34 shows a part of the diagram of FIG. 33 to which a transformation in accordance with FIGS. 35a, 35b and 35c is applied.

FIGS. 36a and 36b show the transformed flow diagrams; the transformation represented in FIGS. 37a and 37b is applied to the diagram of FIG. 36b.

FIGS. 38a, 38b and 38c show the final flow diagrams as well as the structure of the filter device in accordance with the invention corresponding to the analog filter of FIG. 32.

FIG. 42 shows an analog low-pass filter in which a capacitor has been dispensed with.

DESCRIPTION OF THE PREFERRED EMBODIMENTS

Figure 1:
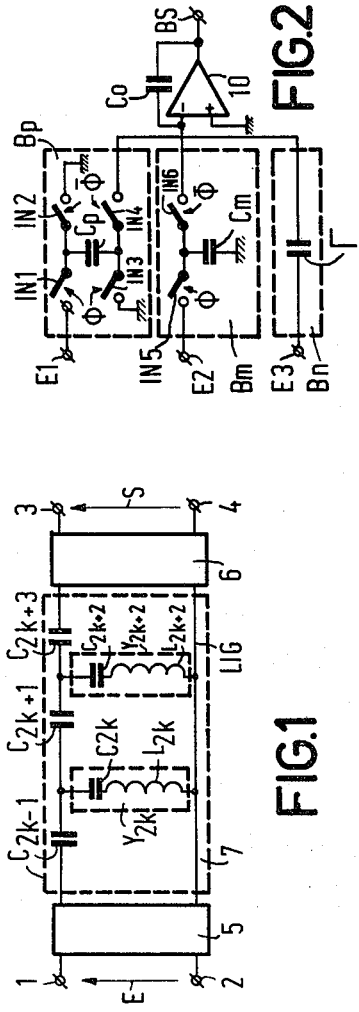
FIG. 1 represents a filter device comprising an analog high-pass ladder filter to be simulated by means of switched-capacitance integrating networks.

The filter device shown in FIG. 1 comprises input terminals 1 and 2 for receiving a voltage E to be filtered and terminals 3 and 4 on which a filtered output voltage S is available. Between an input circuit 5 and an output circuit 6, the filter device comprises an analog high-pass ladder filter 7, which comprises elementary circuits of the same structure connected in cascade. In the Figure the various elements constituting the high-pass filter are designated by the references indicating their values. The filter comprises a plurality of capacitors having capacitances ..., $C_{2k-1}$, $C_{2k+1}$, $C_{2k+3}$, ... connected in series with each other and a plurality of branches representing admittances ..., $Y_{2k}$, $Y_{2k+2}$, ... comprising capacitors having capacitances ..., $C_{2k}$, $C_{2k+2}$, ... connected in series with self-induction coils having coeeficients of self-induction ..., $L_{2k}$, $L_{2k+2}$, ..., respectively.

One end of the branch having the admittance $Y_{2k}$ is connected to the interconnected electrodes of the capacitors with the capacitances $C_{2k-1}$, $C_{2k+1}$, and one end of the branch having the admittance $Y_{2k+2}$ is connected to the interconnected electrods of the capacitors with the capacitances $C_{2k+1}$ and $C_{2k+3}$. The other ends of the branches with the admittances $Y_{2k}$ and $Y_{2k+2}$ are connected to a common line LIG.

Figure 2:
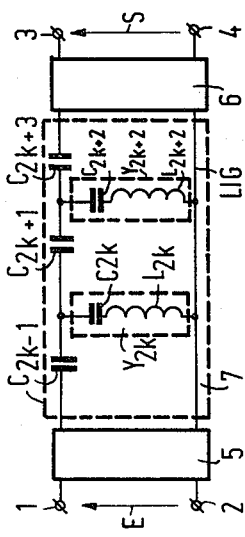
FIG. 2 represents a switched-capacitance integrating network of the type employed for the invention.

Hereinafter, a filter is described which is equivalent to the analog filter 7, but which employs a group of switched-capacitance integrating networks. FIG. 2 represents the typical structure of a switched-capacitance integrating network. This network comprises three input terminals E1, E2 and E3 and one output terminal BS. Each input terminal corresponds to a different type of transfer function. As will be explained hereinafter, the number of terminals corresponding to the same type of transfer function may be varied.

The integrating network shown in FIG. 2 includes an operational amplifier 10 whose output constitutes the terminal BS. A capacitor $C_o$ is connected between this output and the (−) input of the operational amplifier 10. The (+) input of the amplifier is connected to ground and the (−) input is connected to the outputs of the three branches Bp, Bm, and Bn. The branch Bp includes a capacitor Cp having one electrode connected to the terminal E1 via a switch IN1 controlled by a voltage $\phi$, and to ground via a switch IN2 controlled by a voltage $\bar{\phi}$. The other electrode is connected to ground via a switch IN3 controlled by a voltage $\phi$ and to the (−) input of the operational amplifier 10 via a switch IN4 controlled by a voltage $\bar{\phi}$. The branch Bm comprises a capacitor Cm having one electrode connected to the terminal E2 via a switch IN5 controlled by a voltage $\phi$, and to the (−) input of the amplifier 10 via a switch IN6 controlled by a voltage $\bar{\phi}$. The other electrode is connected to ground. The branch Bn comprises a capacitor, having one electrode connected to the terminal E3 and having the other electrode connected to the (−) input of the amplifier 10.

Figure 3:
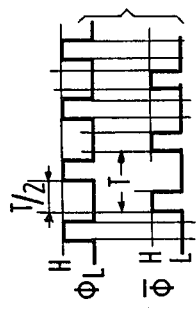
FIG. 3 shows the waveforms of the control signals for the switched-capacitance integrating networks.

FIG. 3 shows the waveforms of the control voltages $\phi$ and $\bar{\phi}$. When these voltages have the level H, the switches are closed and when they have the level L the switches are open. The voltages $\phi$ and $\bar{\phi}$ are periodic and have a period T. It is to be noted that the voltages $\phi$ and $\bar{\phi}$ never simultaneously have the level H and the rising edges of these voltages are spaced from each other by an interval equal to T/2.

The transfer function of the network of FIG. 2 between the terminal E2 and the terminal BS will now be determined. Hereinafter, the capacitance values of the capacitors will be indicated by the references of the capacitors. It is assumed that at an instant k'T (k' being an integer), the switch IN5 is closed and the capacitor Cm is charged to the voltage $x_m$ (k'T) which appears between the terminal E2 and ground. The capacitor $C_o$ is charged by the output voltage $y(k_{T-T/2})$ determined at a previous instant (k'T−T/2) corresponding to an instant at which the switch IN6 was in the closed position. Subsequently, at the instant k'T+T/2, the switch IN6 is again closed and a new output voltage y(k'T+T/2) is formed. This causes a charge transfer between the capacitors Cm and $C_o$, so that:

$$C_o Y(k'T+1/2T) = C_o Y(k'T-1/2T) - C_m X_m(k'T) \quad (1)$$

By introducing the transforms of z, the transfer function may be written as:

$$H(z) = -\frac{C_m}{C_o} \cdot \frac{z^{-\frac{1}{2}}}{1-z^{-1}} \quad (2)$$

If s is the LAPLACE operator, s* is defined as a transform of s by the following relations:

$$s^* = \frac{2}{T} sh\frac{sT}{2} = \frac{1}{T}(z^{\frac{1}{2}} - z^{-\frac{1}{2}}) = \frac{1}{T} \frac{z^{-\frac{1}{2}}}{1-z^{-1}} \quad (3)$$

in such a way that the transfer function as a function of s* will be:

$$H_m(s^*) = \frac{1}{r_m s^*} \text{ where } r_m = \frac{C_o}{C_m} T \quad (4)$$

a perfect analog integrator has a transfer function:

$$H(s) = -\frac{1}{rs} \quad (5)$$

When relations (4) and (5) are compared, it is found that the two responses are identical provided that the physical frequencies "f" are replaced by the transformed frequencies f* by means of the relations (3).

$$f^* = \frac{f_e}{\pi} \sin\left(\pi \frac{f}{f_e}\right) \quad (6)$$

when $f_e = 1/T$

Subsequently, the transfer function of the network of FIG. 2 between the terminal E1 and the terminal BS is determined. The difference with respect to what has been said for the branch $B_m$ is that the electrodes of the capacitor $C_p$ are inverted between its charging by the voltage $x_p$ (k'T) applied to the terminal E1 and its discharging into the capacitor $C_o$, in such a way that its transfer function $H_p(s^*)$ is written as:

$$H_p(s^*) = \frac{1}{r_p s^*} \text{ where } r_p = \frac{C_o}{C_p} T \tag{7}$$

Finally the transfer function of the network of FIG. 2 between the terminal E3 and the terminal BS is determined. The references $x_n(t)$, $q(t)$, $q_o(t)$ and $y(t)$ respectively represent the values at the instant "t" of the voltage applied to the terminal E3, the charge of the capacitor $\Gamma$, the charge of the capacitor $C_o$ and the output voltage at the terminal BS. Since in practice the signals $x_n(t)$ and $y(t)$ vary instantaneously at the sampling instants $t=k'T$, the charges $q(t)$ and $q_o(t)$ will change in the same way. If the operational amplifier 10 is assumed to be ideal, the variations of the charge of the capacitor $\Gamma$ have an immediate effect on the charge on $C_o$ with a change of sign in such a way that:

$$q_o(k'T) - q_o[(k'-1)T] = -q(k'T) + q[(k'-1)T] \tag{8}$$

which yields the transfer function:

$$H_n(s^*) = -(\Gamma/C_o) \tag{9}$$

As already stated, the number of branches $B_p$, $B_m$ and $B_n$ may be varied. When it is assumed that there are "u" branches $B_p$, "v" branches $B_m$ and "w" branches $B_n$ and when the voltages applied to the inputs of the various branches $B_p$, $B_m$, $B_n$ are designated:

$x_p^a$, $x_m^b$, $x_n^c$, where $a=1, 2, \ldots u$, $B=1, 2, \ldots v$, $c=1, 2, \ldots w$ (a, b, c being indices), the value of the output signal YS may be expressed as a function of the various input signals $x_p^a$, $x_m^b$, $x_n^c$:

$$YS(s) = \sum_{a=1}^{u} -\frac{1}{r_m^a s} \cdot x_m^a + \sum_{b=1}^{v} \frac{1}{r_p^b s} \cdot \tag{10}$$

$$x_p^b + \sum_{c=1}^{w} -\mu_n^c \cdot x_n^c$$

where $r_m^a = \frac{C_o}{C_m^a} T$ $r_p^b = \frac{C_o}{C_q^b} T$ $\mu_n^c = \frac{\Gamma^c}{C_o}$ in which expressions $C_m^a$ is the value of the capacitance constituting the $a^{th}$ branch $B_m$, $C_p^b$ the capacitance of the $b^{th}$ branch $B_p$ and $\Gamma^c$ the capacitance of the $c^{th}$ branch $B_n$.

If a plurality of networks of the type shown in FIG. 2 are cascaded, the switches, of which one end is connected directly to the input or to the output of the same operational amplifier, may be controlled by the same voltage $\emptyset$ or $\bar{\emptyset}$.

In the rest of the present description, reference is made to flow diagrams. More details of this subject can be found in the publication entitled "Graphes de fluence" by MM. L.P.A. ROBICHAUD, BOISVERT, J. ROBERT, edited by EYROLLES, PARIS, LES PRESSES DE L'UNIVERSITE LAVAL-QUEBEC.

In accordance with this method it is possible to represent a system of linear equations which relate various quantities to each other in graphical form. Each of the quantities is represented by a circle or a point and the various circles thus defined are connected by oriented arcs representing a transmission factor. Thus, for example, a relation of the form:

$$X_n = A1 \cdot X_{n1} + A2 X_{n2} + \ldots AmxX_{mn} \tag{11}$$

is given.

The circle associated with the quantity $X_n$ is the terminating point for the various arcs originating from the circles which represent the quantities $X_{n1}, X_{n2}, \ldots X_{mn}$. A transmission factor A1, A2, $\ldots$ Am is attributed to each arc. The high-pass filter forming part of the filter device in accordance with the invention corresponds to the flow diagram shown in FIG. 4. This figure thus defines how the high-pass filter in accordance with the invention is realized by means of switched-capacitance integrating networks.

A filter device comprising a first group of switched-capacitance integrating networks for simulating an analog high-pass ladder filter structure is characterized in that the first group is constituted by a plurality of pairs of switched-capacitance integrating networks $\ldots$ RA$_{2k}$, RB$_{2k}$, $\ldots$ each of which comprises three inputs EA1, EA2 and EA3 and one output SA for the networks $\ldots$ RA$_{2k}$ $\ldots$, and EB1, EB2 and EB3 and one output SB for the networks $\ldots$ RB$_{2k-2}$, $\ldots$, the first input EA1 of the network RA$_{2k}$ being connected to the output SB of the network RB$_{2k-2}$, the second input EA2 to the output of the network RB$_{2k+2}$, the third input EA3 to the output of the network RB$_{2k}$, the first input EB1 of the network RB$_{2k}$ being connected to the output of the network RB$_{2k=2}$, the second input EB2 to the output SA of the network RA$_{2k}$ and the third input EB3 to the output of the network RB$_{2k+2}$, the network RA$_{2k}$ having the following transfer functions:

between the first input EA1 and the output SA $$(-1)^{k-1}\lambda_k \cdot \frac{R}{sL_{2k}}$$

between the second input EA2 and the output SA $$(-1)^{k+1}\mu_k \cdot \frac{R}{sL_{2k}}$$

between the third input EA3 and the output SA $$(-1)^{k+1} \cdot \frac{R}{sL_{2k}}$$

while the network RB$_{2k}$ has the following transfer functions:

between the first input EB1 and the output SB:

$$s(-1)^{k+1}\lambda_k C_{2k} R \cdot \frac{(-1)^k}{s(\lambda_k + \mu_k)C_{2k}R} = -\frac{\lambda_k}{\lambda_k + \mu_k} = $$

$$-\frac{C_{2k-1}}{C_{2k-1} + C_{2k+1}}$$

between the second input EB2 and the output SB:

$$1 \cdot \frac{(-1)^k}{s(\lambda_k + \mu_k)C_{2k}R} + \frac{(-1)^k(C_{2k-1} + C_{2k} + C_{2k+1})}{s(C_{2k-1} + C_{2k+1})C_{2k}R}$$

between the third input EB3 and the output SB:

$$s(-1)^{k+1}\mu_k C_{2k} R \cdot \frac{(-1)^k}{s(\lambda_k + \mu_k)C_{2k}R} = -\frac{\mu_k}{\lambda_k + \mu_k} = $$

$$-\frac{C_{2k+1}}{C_{2k-1} + C_{2k+1}}$$

In the above expressions:

$$\lambda_k = \frac{C_{2k-1}}{C_{2k-1} + C_{2k} + C_{2k+1}} \quad \mu_k = \frac{C_{2k+1}}{C_{2k-1} + C_{2k} + C_{2k+1}}$$

s being the LAPLACE operator, R an arbitrary constant having the units of resistance.

Figure 4:
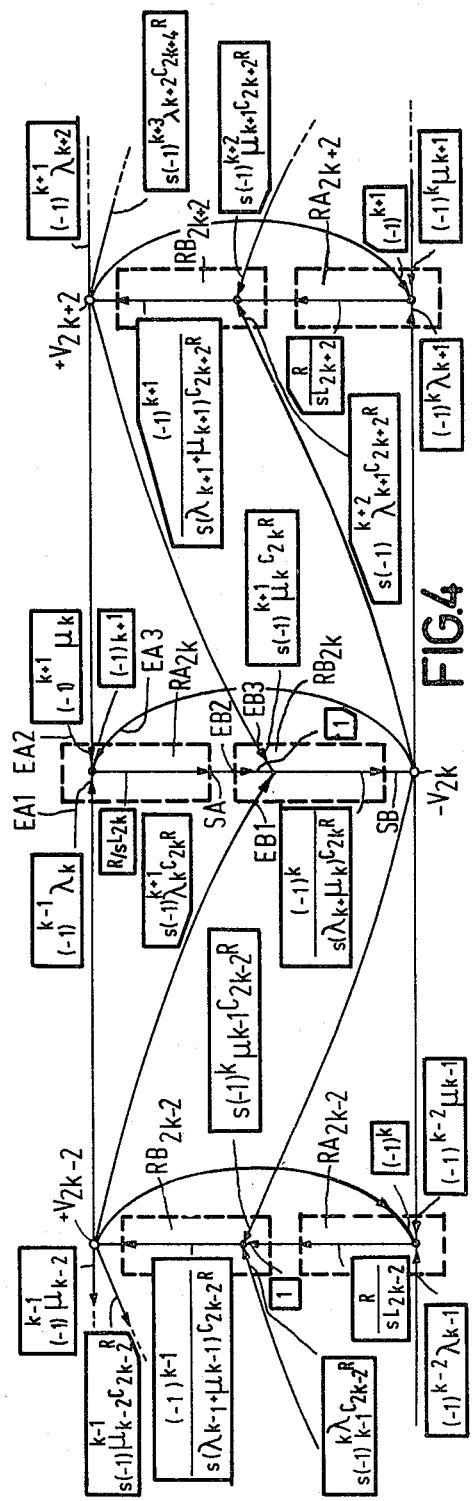
FIG. 4 shows the flow diagram which defines the structure of a high-pass filter that can be realized by means of switched-capacitance integrating networks.
Figure 5:
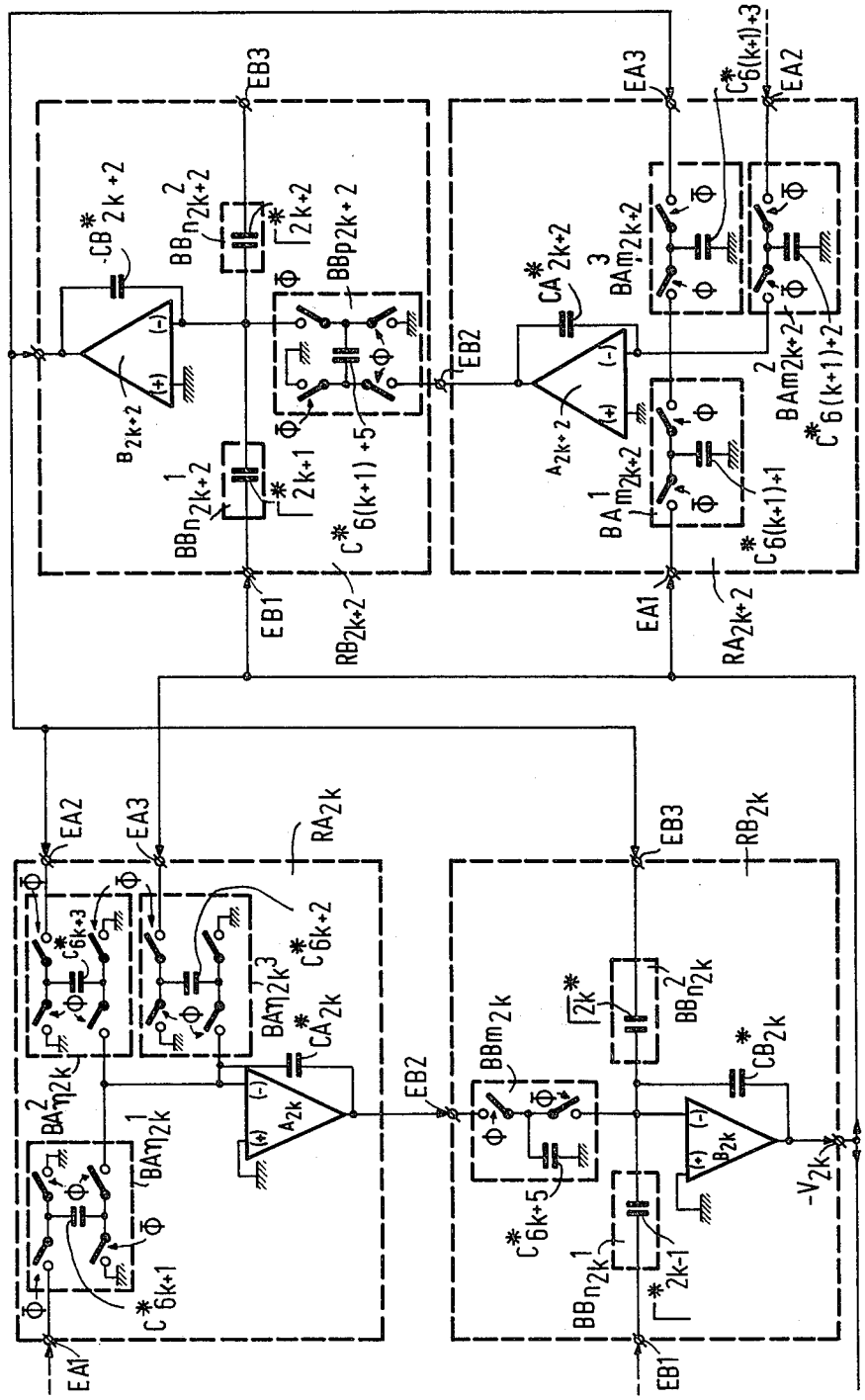
FIG. 5 shows a circuit diagram of the switched-capacitance integrating networks forming part of the filter defined in FIG. 4.

FIG. 5 shows the circuit diagram of the networks $RA_{2k}$, $RB_{2k}$, $RA_{2k+2}$ and $RB_{2k+2}$ forming part of the filter which is defined by means of the diagram of FIG. 4. The network $RA_{2k}$ is formed by means of an operational amplifier $A_{2k}$ provided with a feedback capacitor $CA^*_{2k}$, which connects its output to its (−) input. The ends of the branches of the type $B_p$ are connected to the (−) amplifier input. The branches are designated $BAp^1_{2k}$, $BAp^2_{2k}$, $BAp^3_{2k}$ and respectively comprise the capacitors $C^*_{6k+1}$, $C^*_{6k+3}$ and $C^*_{6k+2}$. One of the electrodes of each of these capacitors is connected to the (−) input of the amplifier $A_{2k}$ by means of a switch which is controlled by the voltage ∅. The other ends of the branches $BAp^1_{2k}$, $BAp^2_{2k}$, and $BAp^3_{2k}$ are respectively connected to the inputs EA1, EA2 and EA3.

The network $RB_{2k}$ is formed by means of an operational amplifier $B_{2k}$ provided with a feedback capacitor $CB^*_{2k}$, which connects its (−) input to its output. Connected to the (−) input is one end of the branch of the type Bm which is designated $BBm_{2k}$. This branch comprises a capacitor $C^*_{6k+5}$. The ends of the two branches of the type Bn are also connected to the (−) input. These branches, designated $BBn^1_{2k}$ and $BBn^2_{2k}$, respectively, comprise the capacitors $\Gamma^*_{2k-1}$ and $\Gamma^*_{2k}$. The other ends of the branches $BBn^1_{2k}$, $BBm_{2k}$ and $BBn^2_{2k}$ are connected to the terminals EB1, EB2 and EB3. One of the electrodes of the capacitor $C^*_{6k+5}$ is connected to the (−) input of the amplifier $B_{2k}$ via a switch which is controlled by the voltage ∅.

The network $RA_{2k+2}$ is formed by means of an operational amplifier $A_{2k+2}$ provided with a feedback capacitor $CA^*_{2k+2}$, which connects its (−) input to its output. Connected to the (−) input is one end of each of three branches of the type Bm, which respectively bear the references $BAm^1_{2k+2}$, $BAm^2_{2k+2}$ and $BAm^3_{2k+2}$, and respectively comprise the capacitors $C^*_{6(k+1)+1}$, $C^*_{6(k+1)+3}$ and $C^*_{6(k+1)+2}$. One of the electrodes of each of these capacitors is connected to the (−) input of the amplifier $A_{2k+2}$ via a switch which is controlled by a voltage ∅. The other ends of the branches $BAm^1_{2k+2}$, $BAm^2_{2k+2}$, $BAm^3_{2k+2}$ are connected to the terminals EA1, EA2 and EA3.

The network $RB_{2k+2}$ is formed by means of an operational amplifier $B_{2k+2}$ provided with a feedback capacitor $CB^*_{2k+2}$ which connects its (−) input to its output. Connected to the (−) input are one end of each of the two branches of the type Bn, designated $BBn^1_{2k+1}$ and $BBn^2_{2k+2}$ which comprise the capacitors $\Gamma^*_{2k+1}$ and $\Gamma^*_{2+2}$, and one end of a branch of the type Bp, designated $BBp_{2k+2}$, which comprises a capacitor $C^*_{6(k+1)+5}$. One electrode of this capacitor is connected to the (−) input of the amplifier $B_{2k+2}$ via a switch which is controlled by the voltage ∅. The other ends of the branches $BBn^1_{2k+2}$, $BBp_{2k+2}$ and $BBn^2_{2k+2}$ are respectively connected to the terminals EB1, EB2 and EB3.

In FIG. 5 certain connections are shown which correspond to those of FIG. 4. The output of the network $RB_{2k}$ is connected to the inputs EA1 and EB1 of the networks $RA_{2k+2}$ and to the input EA3 of the network $RA_{2k}$. The output of the network $RB_{2k+2}$ is connected to the inputs EA2 and EB3 of the networks $RA_{2k}$ and $RB_{2k}$ and to the input EA3 of the network $RA_{2k+2}$.

The values of the capacitances should be such that:

$$C^*_{6k+1}/CA^*_{2k} = \lambda_k RT/L_{sk} \tag{12}$$

$$C^*_{6k+2}/CA^*_{2k} = RT/L_{2k} \tag{13}$$

$$C^*_{6k+3}/CA^*_{2k} = \mu_k RT/L_{2k} \tag{14}$$

$$C^*_{6k+5}/CB^*_{2k} = T/(\lambda_k + \mu_k) C_{2k}R \tag{15}$$

$$\Gamma^*_{2k-1}/CB^*_{2k} = \lambda_k/(\lambda_k + \mu_k) \tag{16}$$

$$\Gamma^*_{2k}/CB^*_{2k} = \lambda_k/(\lambda_k + \mu_k) \tag{17}$$

It is to be noted that the networks $RA_{2k}$ and $RA_{2k+2}$ differ with respect to the type of branches which they comprise. In the network $RA_{2k}$ branches of the type Bp are used, while in the network $RA_{2k+2}$ branches of the type Bm are used. Similarly, in the network $RB_{2k}$ a branch of the type $B_m$ is used, while in the network $RB_{2k+2}$ a branch of the type Bp is used. In these two last-mentioned networks the two branches of the type Bn are of the same nature. Thus allowance is made for the sign of the transfer function to be realized. Thus, it is to be borne in mind that the pairs of networks whose reference index differs by a multiple of four from the index 2k have the same structure, except for the capacitance values, and that the pairs of networks $RA_{2k}$ and $RB_{2k}$ and the pairs of networks whose reference index differs by a multiple of four from the index 2k+2 also have the same structure, except for the values of the capacitances, as the pairs of networks $RA_{2k+2}$ and $RB_{2k+2}$.

Figure 6:
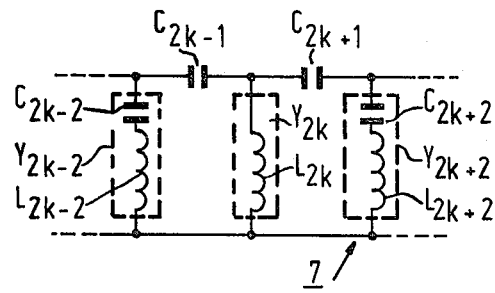
FIG. 6 shows an analog high-pass ladder filter in which a capacitor has been replaced by a short-circuit.

It is evident that one or more of the capacitors, such as $C_{2k}$ of the filter 7, may be dispensed with. FIG. 6 shows the case in which the capacitor $C_{2k}$ has been dispensed with and replaced by a direct interconnection, i.e. the equivalent of a capacitor having an infinite capacitance. The series connection is thus reduced to the coil $L_{2k}$, so that the corresponding attenuation peak occurs at the frequency zero, while in the case when the capacitor $C_{2k}$ and the coil $L_k$ are connected in series the attenuation peak occurs at the frequency: $\frac{1}{2}\pi \sqrt{L_{2k} \cdot C_{2k}}$.

For simulating the filter shown in FIG. 6 using the transfer diagram of FIG. 4, $C_{2k}$ is made to approximate infinity, so that:

$$\lambda_k = \mu_k = 0.$$

Furthermore, it is to be noted that in this situation it is possible to write:

$$(\lambda_k + \mu_k) C_{2k} = C_{2k-1} + C_{2k+1}$$

$$\frac{\lambda_k}{\lambda_k + \mu_k} = \frac{C_{2k-1}}{C_{2k-1} + C_{2k+1}}$$

$$\frac{\mu_k}{\lambda_k + \mu_k} = \frac{C_{2k+1}}{C_{2k-1} + C_{2k+1}}$$

Figure 7:
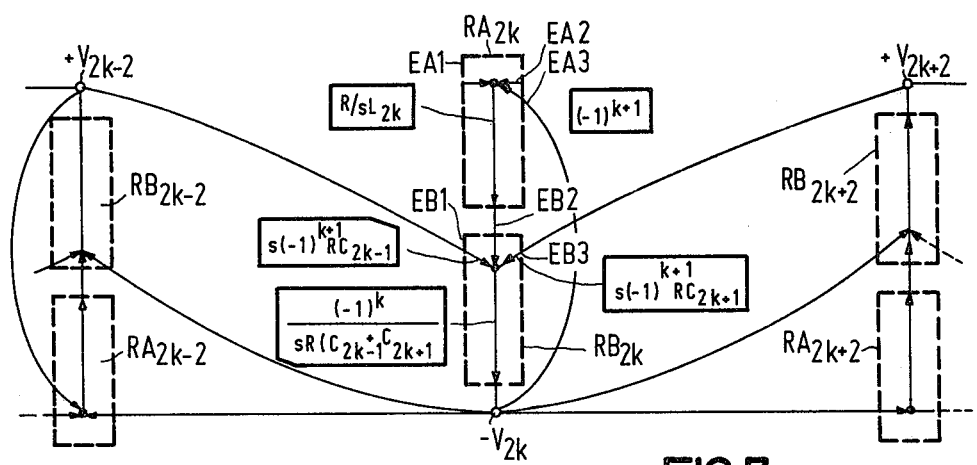
FIG. 7 shows the flow diagram corresponding to the filter of FIG. 6, realized by means of switched-capacitance networks.

The flow diagram shown in FIG. 7 corresponds to the filter of FIG. 6. Referring to FIG. 4, it can be seen that the arcs which terminate at the input EA1 of the network $RA_{2k}$ and at the input EA2 are dispensed with. Moreover, the capacitance of the capacitor $C_{2k}$ does not occur in the transfer functions of the network $RB_{2k}$.

Thus, the transfer function between the input EB1 and the output of said network is:

$$s(-1)^{k+1} RC_{2k-1} \cdot \frac{(-1)^k}{sR(C_{2k-1}+C_{2k+1})}$$

and between the input EB3 and the output it is:

$$s(-1)^{k+1} RC_{2k-1} \cdot \frac{(-1)^k}{sR(C_{2k-1}+C_{2k+1})}$$

Figure 8:
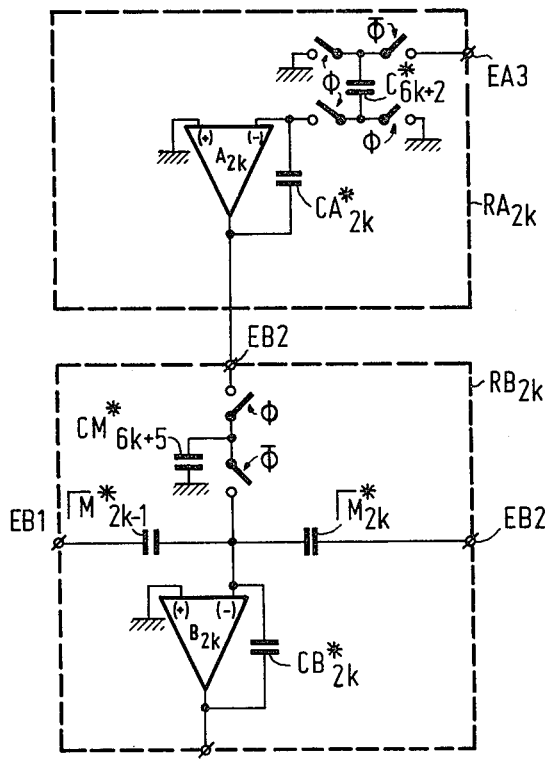
FIG. 8 shows the circuit diagram of the switched-capacitance networks corresponding to the flow diagram of FIG. 7.

FIG. 8 shows the circuit diagrams of the networks $RA_{2k}$ and $RB_{2k}$.

For the network $RA_{2k}$ only the capacitor with a capacitance $C^*_{6k+2}$ is left, which is connected to the (−) input of the amplifier $A_{2k}$ and the terminal EA3 in the same way, the value of the capacitance being given by the formula (13).

The network $RB_{2k}$ has the same structure, the values of the capacitances, which in this case are designated $CM^*_{6k+5}$, $\Gamma M^*_{2k}$, $\Gamma M^*_{2k-1}$, respectively corresponding to the capacitances $C^*_{6k+5}$, $\Gamma^*_{2k}$ and $\Gamma^*_{2k-1}$ of FIG. 5, being given by the following formulas:

$$CM^*_{6k+5}/CM^*_{2k} = T/(C_{2k-1}+C_{2k+2})R \quad (15')$$

$$\Gamma M^*_{2k-1}/CB^*_{2k} = C_{2k-1}/(C_{2k-1}+C_{2k+1}) \quad (16')$$

$$\Gamma M^*_{2k}/CB^*_{2k} = C_{2k+1}/(C_{2k-1}+C_{2k+1}) \quad (17')$$

Figure 9:
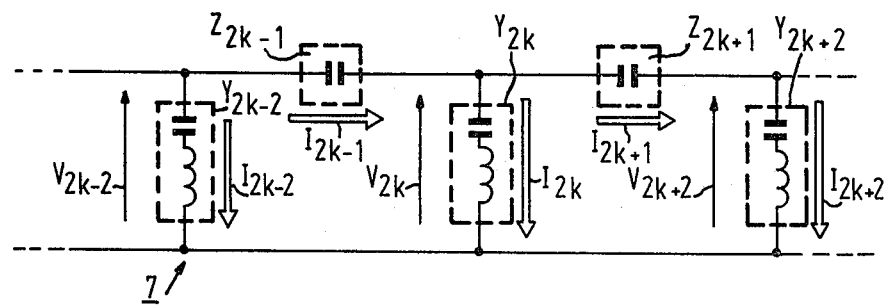
FIG. 9 shows a basic structure of an analog high-pass ladder filter on which a first flow diagram shown in FIG. 10 is based.

It will be demonstrated that the structure defined by the flow diagram of FIG. 4 corresponds to a high-pass ladder filter. FIG. 9 represents the analog high-pass filter 7. In this Figure the electrical quantities are represented by means of which, through transformations to be explained hereinafter, the flow diagram of FIG. 4 can be obtained which corresponds to an embodiment of the invention.

$V_{2k}$ is the voltage across the terminals of the circuit having the admittance $Y_{2k}$;

$I_{2k-1}$ is the current through the capacitor whose impedance is $Z_{2k-1}$;

$I_{2k}$ is the current through the branch with the admittance $Y_{2k}$;

$I_{2k+1}$ is the current through the capacitor $C_{2k+1}$ whose impedance is $Z_{2k+1}$.

Now the following relations may be expressed:

$$-V_{2k} = 1 \times (-V_{2k-2} + Z_{2k-1} I_{2k-1}) \quad (18)$$

$$I_{2k-1} = Y_{2k}(-1) \cdot (-V_{2k}) + I_{2k+1} \quad (19)$$

Figure 10:
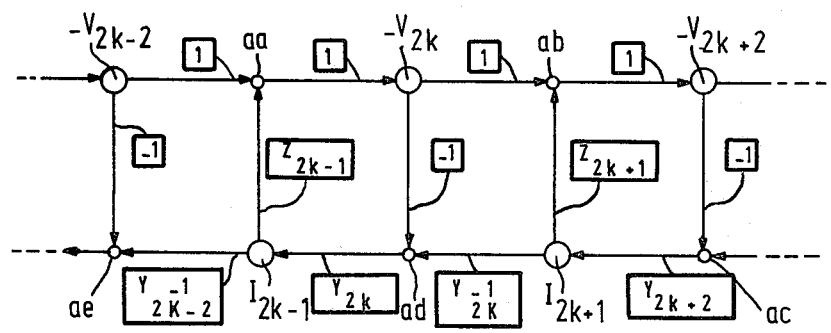

These relations are represented in the form of flow diagrams in FIG. 10. The large circles in this Figure relate to the variables $-V_{2k-2}$, $-V_{2k}$, $-V_{2k+2}$, $I_{2k-1}$, $I_{2k+1}$, while the small circles "aa", "ab", "ac", "ad" and "ae" relate to auxiliary variables which are not explained. The circles, which hereinafter will be referred to as points, are interconnected by different arcs. The encircled values represent the transmission factors associated with the respective arcs. Thus, the pairs of points $(-V_{2k-2}, \text{aa})$, $(\text{aa}, -V_{2k})$, $(-V_{2k}, \text{ab})$, $(\text{ab}, -V_{2k+2})$ are interconnected by an arc which extends in the order and which corresponds to a transmission factor of "+1". Similarly, the pairs of points $(-V_{2k-2}, \text{ae})$, $(-V_{2k}, \text{ad})$ and $(-V_{2k+2}, \text{ac})$ are interconnected by an arc representing a transmission coefficient of "−1", the pair $(I_{2k-1}, \text{aa})$ by an arc representing a transmission factor equal to $Z_{2k-1}$, the pair $(I_{2k+1}, \text{ab})$ by an arc representing a transmission factor equal to $Z_{2k+1}$, the pairs (ac, $I_{2k+1}$), ($I_{2k+1}$, ad), (ad, $I_{2k-1}$) and ($_{2k-1}$, ae) are interconnected by arcs representing the transmission factors $Y_{2k+2}$, $Y^{-1}_{2k}$, $Y_{2k}$ and $Y^{-1}_{2k-2}$.

Figure 11:
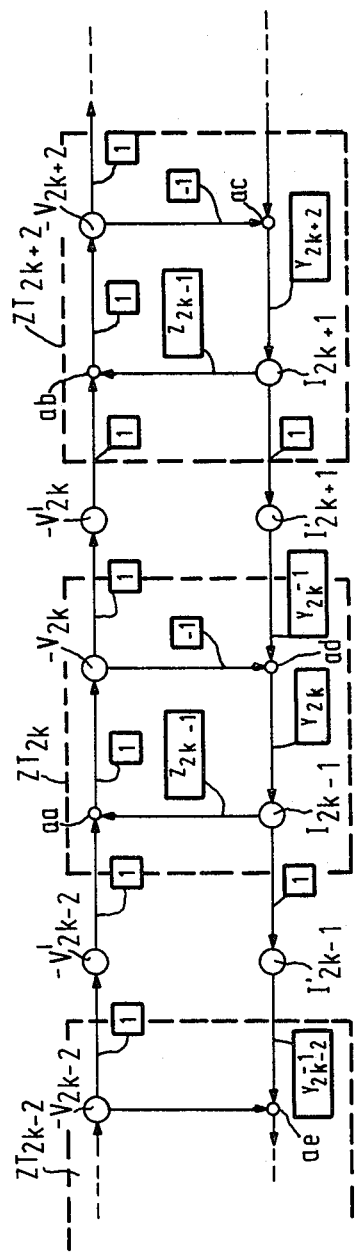
FIG. 11 shows a flow diagram corresponding to that of FIG. 10, but in which zones are indicated to which the transformation of the diagram shown in FIGS. 12a and 12b is to be applied.

FIG. 11 shows the same diagram as that of FIG. 10. Here points $-V_{2k-2}$, $-V_{2k}$, $I_{2k+1}$, $I_{2k-1}$ have been duplicated; the duplicated points which respectively bear the reference $-V'_{2k-2}$, $-V'_{2k}$, $I'_{2k+1}$, $I'_{2k-1}$ enable the zones $ZT_{2k-2}$, $ZT_{2k}$, $ZT_{2k+2}$ to be bounded by means of dashed lines. The zone $ZT_{2k}$ corresponds to a relation which relates points $-V'_{2k-2}$, $I'_{2k-1}$, $-V'_{2k}$, $I'_{2k+1}$. The zones will be modified by means of the transformation illustrated in FIGS. 12a and 12b.

Figure 12B:
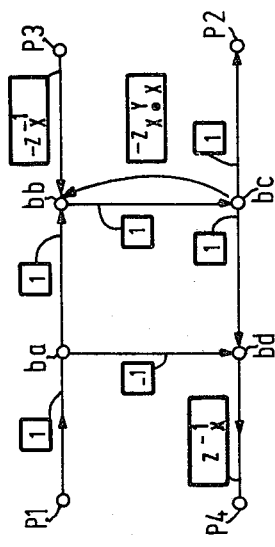
Figure 12A:
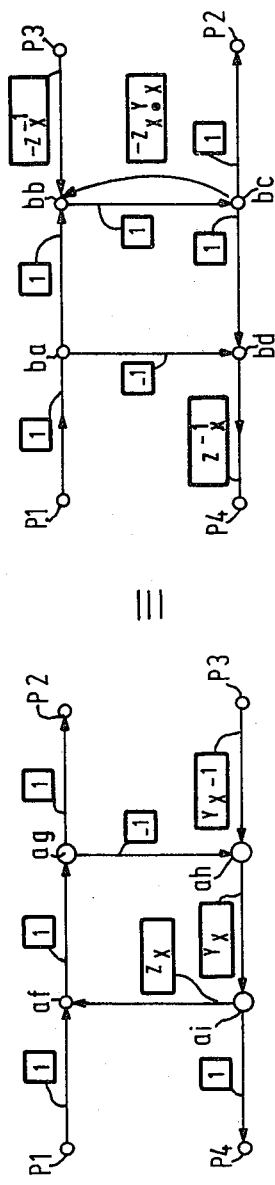

By means of this transformation a diagram shown in FIG. 12a, which relates the four points designated P1, P2, P3 and P4, is made to correspond to another diagram shown in FIG. 12b.

In addition to the points P1, P2, P3, P4 already mentioned, the diagram of FIG. 12a also comprises points "af," "ag," "ah," "ai." The pairs of Points (P1, af), (af, ag) and (ag, P2) are interconnected by arcs to which a transmission factor of "+1" is assigned, the pairs (ai, af) and (ag, ah) by arcs to which respectively the factors $Z_x$ and "−1" are assigned, and the pairs (P3, ah), (ah, ai) and (ai, P4) by arcs which respectively represent the factors $Y_x^{-1}$, $Y_x$ and "1".

In addition to the points P1, P2, P3, P4 the diagram of FIG. 12b comprises the points ba, bb, bc and bd; the pairs of points (P1, ba), (ba, bb), (P3, bb), (bd, P4), (bc, bd), (bc, P2), (ba, bd), (bb, bc) and (bc, bb) are interconnected by arcs which respectively correspond to the following transmission factors:

"1", "1", $-Z_x^{-1}$, $Z_x^{-1}$, "1", "1", "−1", "1" and $-Z_x \cdot Y_x$.

The various points $-V_{2k-2}$, $I_{2k-1}$, $-V_{2k}$, $I_{2k+1}$ and $-V_{2k+2}$ in the diagram of FIG. 11 are found in FIG. 13. Moreover, the points ca, cb, cc, cd, ce, cf, cg, ch, ci, cj, ck and cl are shown. Points cb, ce, ch and ck are intermediate points. That is, these points do not constitute the origins or terminations of any arc representing a transmission factor equal to "1". Thus, the transmission factor "1" is assigned to the following arcs: (ca, cb) (cb, cc) (cf, ce) (ce, cd) (ci, ch) (ch, cg) (cj, ck) (ck, cl). By means of the intermediate points the zones $ZTT_{2k-2}$, $ZTT_{2k}$ and $ZTT_{2k+2}$, which are bounded by dashed lines, can be indicated. Thus, the zone $ZTT_{2k}$ corresponds to a relation which relates the points "cb," "ce," "ch" and "ck" to each other.

In the zone $ZTT_{2k-2}$ the pairs of points $(-V_{2k-2}, \text{ca})$ (ca, cl) and (cl, $I_{2k-1}$) are separated by arcs corresponding to transmission factors "1", "−1" and $Z^{-1}_{2k-1}$, respectively.

In the zone $ZTT_{2k}$ the pairs of points ($I_{2k+1}$, cc) (cd, $I_{2k+1}$) $(-V_{2k}, \text{ci})$ (cj, $-V_{2k}$) (ci, cd) (cc, cj) (cj, cc) are interconnected by arcs which correspond to the following transmission factors: $Z_{2k-1}$, $Z^{-1}_{2k+1}$, "1", "1", "−1", "1," $-Z_{2k-1}$, $Y_{2k}$.

In the zone $ZTT_{2k+2}$, the pairs of points (cf, $-V_{2k+2}$) (cg, cf) (cf, cg) are interconnected by arcs representing the transmission factors "1", "1", $-Z_{2k+1} \cdot Y_{2k+2}$.

The transformation represented in FIGS. 14a and 14b is applied to these different zones. The diagram shown in FIG. 14a comprises on the one hand the points P5, P6, P7, P8, which also occur in FIG. 14b, and on the other hand the points cr, Iy, cs, ct, Vy' and Vy. The pairs of points (P5, cr) (Iy, cr) (cs, Iy) (P6, cs) (ct, P7), (Vy', ct) (Vy, Vy') (Vy, P8) (cr, Vy) (Vy, cr) and (ct, cs) are interconnected by arcs whose transmission factors are respectively:

"1", "Zy", $Z^{-1}z$, "1", "1", "1", "1", "1", "1", $-Zy \cdot Yy$ and $-1$.

By means of the envisaged transformation the points cs and ct as well as the points Iy and Vy' can be cancelled. It is to be noted that points Vy and Vy' are identical, because they are connected by a single arc representing a transmission factor "1".

In the diagram of FIG. 14b the pairs of points (P5, cr), (P6, cr), (Vy, P7), (Vy, P8), (Vy, cr) and (cr, Vy) are interconnected by arcs to which the transmission factors "1", $(Zy \cdot Z^{-1}z)$, "1", "1", $-Zy \cdot (Yy + Z^{-1}z)$, "1" are assigned.

Figure 15:
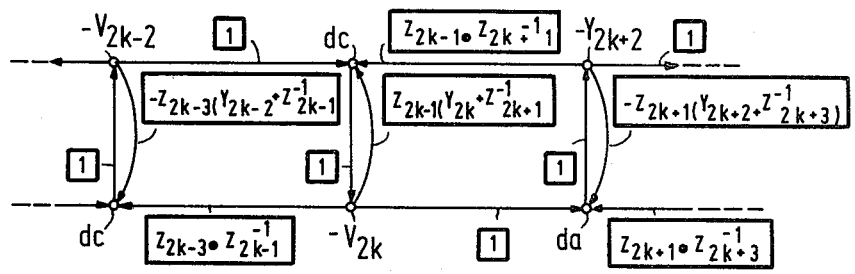
FIGS. 15 and 16 represent successive modifications of the diagram of FIG. 13 to which the transformation of FIGS. 14a and 14b has been applied.

FIG. 15 shows the diagram thus transformed. In addition to the points $-V_{2k-2}$, $-V_{2k}$ and $-V_{2k+2}$, the points da, db and dc are shown. The pairs of points $(-V_{2k-2}, db)$, $(-V_{2k+2}, db)$, $(-V_{2k}, da)$, $(-V_{2k}, dc)$, $(dc, -V_{2k-2})$, $(V_{2k-2}, dc)$, $(-V_{2k}, db)$, $(db, -V_{2k})$, $(-V_{2k+2}, da)$ $(da, -V_{2k+2})$ are interconnected by arcs whose respective transmission factors are as follows:

"1", $(Z_{2k-1} \cdot Z^{-1}_{2k+1})$, "1", $(Z_{2k-3} \cdot Z^{-1}_{2k-1})$, "1",
$-Z_{2k-3} \cdot (Y_{2k-2} + Z^{-1}_{2k-1})$,
$-Z_{2k-1} \cdot (Y_{2k} + Z^{-1}_{2k+1})$, "1",
$-Z_{2k+1} \cdot (Y_{2k+2} + Z^{-1}_{2k+3})$ and "1".

Figure 16:
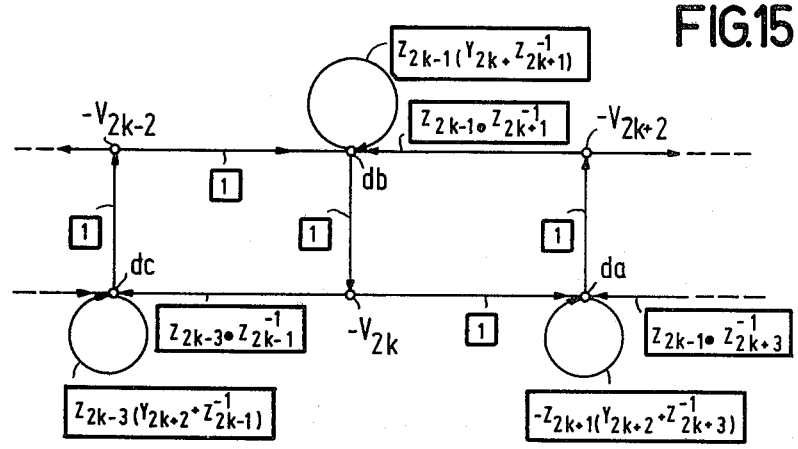
Figure 17A:
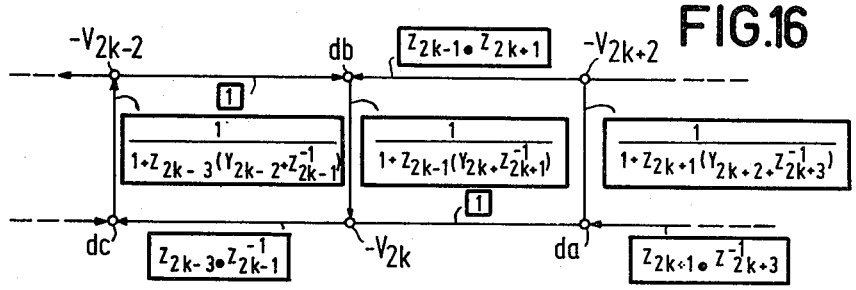

The diagram of FIG. 15 is modified by replacing the arcs interconnecting the pairs of points $(-V_{2k-2}, dc)$ $(-V_{2k}, db)$ and $(-V_{2k+2}, da)$ by loops to points dc, db, da. This is shown in FIG. 16. These loops correspond to a transmission factor equal to:

$-Z_{2k-3} \cdot (Y_{2k-2} + Z^{-1}_{2k-1})$,
$-Z_{2k-1} \cdot (Y_{2k} + Z^{-1}_{2k+1})$ and
$-Z_{2k+1} \cdot (Y_{2k+2} + Z^{-1}_{2k+3})$. In FIG. 17a the loops are cancelled. This cancellation results in a change of the transmission factors corresponding to the arcs issuing from points da, db, dc.

Thus, the arcs interconnecting the pairs of points (dc, $-V_{2k-2}$), (db, $-V_{2k}$), (da, $-V_{2k+2}$) represent the following transmission factors:

$1/[1 + Z_{2k-3}(Y_{2k-2} + Z^{-1}_{2k-1})]$ $1/[1 + Z_{2k-1}(Y_{2k} + Z^{-1}_{2k+1})]$ $1/[1 + Z_{2k+1}(Y_{2k+2} + Z^{-1}_{2k+3})]$

FIG. 17b represents the same diagram as FIG. 17a, but in the last-mentioned diagram the transmission factors are shown as a function of the elements of the analog high-pass filter, shown in FIG. 6, to be simulated. Thus, the transmission factors corresponding to the arcs which interconnect the pairs of points (dc, $-V_{2k+2}$), (db, $-V_{2k}$) and (da, $-V_{2k+2}$) become:

$$\frac{\lambda_{k-1} + \lambda_{k-1} \cdot L_{2k-2} \cdot C_{2k-2} \cdot s}{1 + (\lambda_{k-1} + \mu_{k-1}) L_{2k-2} C_{2k-2} s^2}$$

$$\frac{\lambda_k + \lambda_k \cdot L_{2k} \cdot C_{2k} \cdot s}{1 + (\lambda_k + \mu_k) \cdot L_{2k} \cdot C_{2k} \cdot s^2}$$

$$\frac{\lambda_{k+1} + \lambda_{k+1} \cdot L_{2k+2} \cdot C_{2k+2} \cdot s}{1 + (\lambda_{k+1} + \mu_{k+1}) \cdot L_{2k+2} \cdot C_{2k+2} s^2}$$

The transmission factors corresponding to the arcs interconnecting the pairs of points $(-V_{2k-2}, db)$ and $(-V_{2k}, dc)$ then become respectively: $\mu_k/\lambda_k$ and $\mu_{k-1}/\lambda_{k-1}$.

Figure 19:
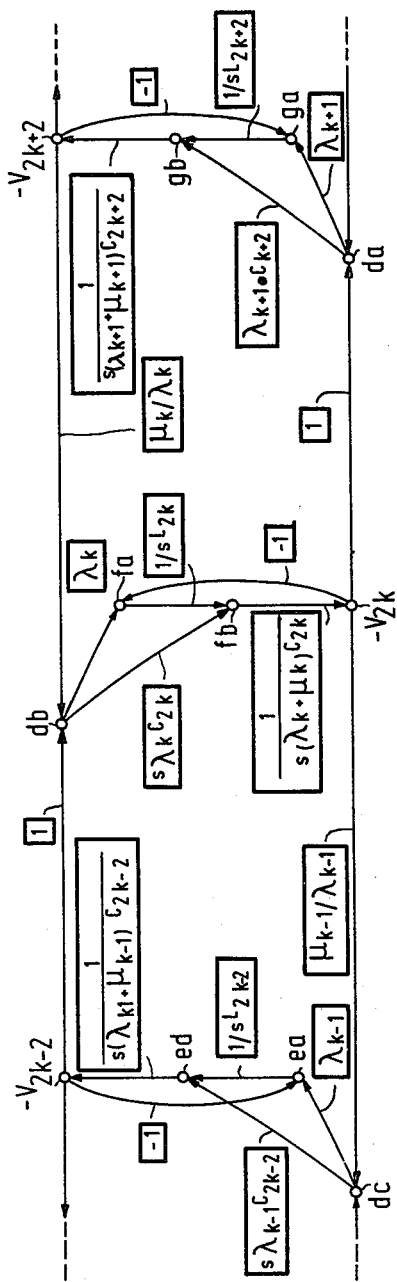
FIG. 19 shows a flow diagram resulting from the last-mentioned transformation.

The arcs interconnecting the pairs of points (dc, $-V_{2k-2}$) (db, $-V_{2k}$) and (da, $-V_{2k-2}$) are transformed in accordance with the transformation represented in FIGS. 18a and 18b. As a result of this transformation, a diagram of an arc (FIG. 18a) which interconnects points P9 and P19 and which has a transmission factor:

$$\frac{L_1 + L_2 s^2}{1 + t_1 \cdot t_2 s^2}$$

is made to correspond to another diagram (FIG. 18b) which, in addition to the points P9 and P10, comprises the points ca, cb. The pairs of points (P9, ca) (ca, cb) (cb, P10) (P9, cb) and (P10, ca) are interconnected by arcs which correspond to the transmission factors: $L_1$, $1/t_1 s$, $1/t_2 s$, $s l_2/t_1$ and $-1$. z By means of this transformation the diagram of FIG. 19 is obtained. Thus, instead of a single arc between the pairs of point (dc, $-V_{2k-2}$), (db, $-V_{2k}$) and (da, $-V_{2k+2}$), this diagram comprises a set of arcs interconnecting the pairs. Thus, between the pairs of points (dc, $-V_{2k-2}$), (db, $-V_{2k}$) and (da, $-V_{2k+2}$) there are respectively the intermediate points ea, eb for the first pair, fa, fb for the second pair, and ga, gb for the third pair. The pairs of points, (db, fa) (fa, fb) (fb, $-V_{2k}$) $(-V_{2k}, fa)$ and (db, fb) are separated by arcs which respectively correspond to the transmission factors: $\mu_k$, $1/sL_{2k}$, $1/s(\lambda_k + \mu_k)$ $C_{2k}$, $s \lambda_k C_{2k}$ and $-1$. For the other pairs of points (dc, $-V_{2k-1}$) $(-V_{2k+2}, da)$ the various transmission factors are determined by substituting for the value of k the value $k-1$ for the first pair and the value $k+1$ for the second pair.

Figure 20:
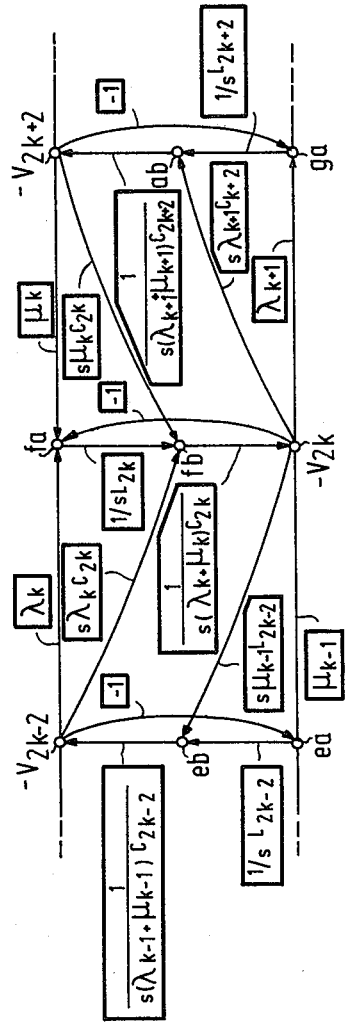
FIG. 20 shows the final diagram which may be compared with the diagram of FIG. 7.

By eliminating points da, db and dc, the diagram of FIG. 20 is obtained. In comparison with the diagram of FIG. 19, this results in new arcs which interconnect the pairs of points $(-V_{2k-2}, fa)$ $(-V_{2k+1}, fa)$ $(-V_{2k-2}, fb)$ $(-V_{2k+2}, fb)$ $(-V_{2k}, ga)$ $(-V_{2k}, gb)$ $(-V_{2k}, ea)$ and $(-V_{2k}, eb)$; these arcs respectively correspond to the following transmission factors: $\lambda_k$, $\mu_k$, $s \lambda_k C_{2k}$, $s \mu_k C_{2k}$, $s \lambda_{k+1} C_{k+2}$, $\mu_{k-1}$, $s \mu_{k-1} L_{2k-2}$.

In order to obtain the diagram of FIG. 4, from the last-mentioned diagram shown in FIG. 20, it is necessary to multiply the coefficients corresponding to the arcs having one end situated at the points . . . $V_{2k-2}$, $V_{2k}$, $V_{2k+2}$, . . . by $(-1)^{k-1}$, the factors corresponding to the arcs ending in the points . . . eb, $-V_{2k-2}$, fb, $-V_{2k}$, gb, $-V_{2k+2}$ by R, and finally the factors corresponding to the arcs originating from the same points by $1/R$.

FIG. 21 represents a complete analog high-pass filter, in conformity with the model of FIG. 1, which can be realized in accordance with the invention. The input circuit 5 comprises a resistor $R_1$ between the input terminal 1 and the end of the capacitor $C_1$ which forms part of the actual analog high-pass filter 7. The filter comprises N series branches with an admittance $Y_2$, . . . $Y_{2n}$. The output circuit 6 comprises a resistor $R_2$ which is connected to the output terminals 3 and 4. The resistor constitutes a branch which represents an impedance $Y_{2N+2}$. Hereinafter it is revealed how in accordance with the characteristic feature of the invention the input circuit 5 and the output circuit 6 can be realized. In the analog high-pass filter shown, the impedance $Z_1$ is constituted by a resistor $R_1$, which forms part of the input circuit 5, and the capacitor $C_1$, which constitutes the first element of the ladder filter. The first series branch is constituted by a capacitor $C_2$ and a self-induction coil $L_2$. The last branch $Y_{2N}$ itself is constituted by a capacitor $C_{2N}$ and a self-induction coil $L_{2N}$. The end of the capacitor $C_{2N}$ which is not connected to the coil is connected to an electrode of a capacitor $C_{2N-1}$ and to an electrode of a capacitor $C_{2N+1}$, whose other electrode is connected to the output terminal 3. The capacitors $C_{2N-1}$ and $C_{2N+1}$ are the sole elements constituting the impedances $Z_{2N-1}$ and $Z_{2N}$, respectively.

If $I_1$ is the current through the impedance $Z_1$, $I_2$ the current through the branch $Y_2$ and $I_3$ the current which flows into the rest of the filter; and if $V_2$ is the voltage across the branch $Y_2$, then:

$$-E + Z_1 I_1 = -V_2 \quad (20)$$

$$I_1 = I_2 + I_3 = Y_2(V_2 + Y_2^{-1} I_3) \quad (21)$$

Furthermore, if on the one hand $I_{2N-1}$, $I_{2N}$, $I_{2n+1}$ are the currents which respectively flow through the impedance $Z_{2N-1}$, the branch $Y_{2N}$ and the combination constituted by the impedance $Z_{N+1}$ and the resistor $R_2$, and on the other hand $V_{2n}$ and $V_{2N+2}$ are the voltages which respectively appear across the branch $Y_{2N}$ and the resistor $R_2$, then:

$$S = V_{2N+2} \quad (22)$$

$$-V_{2N+2} = -V_{2N} + Z_{2N+1} I_{2N+1} \quad (23)$$

$$I_{2N+1} = Y_{2N+2} S \quad (24)$$

The foregoing equations make it possible to draw the diagram in FIG. 22, which should be combined with that of FIG. 10 in order to obtain the complete diagram of high-pass filter of the order $2N+1$.

At the input side, the diagram comprises various arcs interconnecting the points E, ha, hb, $-V_2$, $I_3$, hc, $I_1$. The arcs interconnecting the pairs of points (E, ha) (ha, hb) (hb, $-V_2$) ($I_3$, hc) (hc, $I_1$) ($I_1$, ha) and (hb, hc) represent transmission factors which respectively have the values: $-1$, "1", $Y^{-1}{}_2$, $Y_2$, $Z_1$ and $-1$.

At the output side the diagram comprises a number of arcs interconnecting the points $-V_{2n}$, hd, $=V_{2N+2}$, S, he, hf, $I_{2N+1}$. The arcs interconnecting the pairs of points ($-V_{2N}$, hd) (hd, $-V_{2N+2}$) ($-V_{2N+2}$, S) ($-V_{2N+2}$, he) (he, hf) (hf, $I_{2N+1}$) and (hf, hd) represent transmission factors which respectively have the values: "1", "1", "1"$-1$, $Y_{2N+2}$, "1" and $Z_{2N+1}$. In FIG. 22, Zones $ZT_4$ and $ZT_{2N}$ are represented by dashed lines (also see FIG. 11). In order to enable the transformation represented by FIGS. 12a and 12b to lbe applied, the zones $ZT_2$ and $ZT_{2N+2}$ should be formed by changing the diagrams of the input and output circuits.

In the diagram of the input circuit, the arc representing the pair of points ($I_1$, ha) is duplicated, as is shown in FIG. 23. A first arc represents a transmission factor $R_1$, the second arc a transmission factor $Z'_1$, so that:

$$Z_1 = R_1 + Z'_1. \quad (25)$$

In FIG. 24 the points ha and $I_1$ are split up into three points each: ha', ha" and ha'" for the first point and $I'_1$, $I''_1$ and $I'''_1$ for the second point. The arcs interconnecting the pairs of points (ha', ha") (ha", ha'") ($I'''_1$, $I''_1$) ($I''_1$, $I'_1$) correspond to transmission factors which are all equal to "1". Thus, the zone $ZT_2$ interconnects the points ha", $-V_2$, $I_3$ and $I''_1$.

For the output circuit a virtual point $I_V$ is used, whose value is subsequently elimated, and the point is interconnected to point he by an arc representing a transmission factor $Y^{-1}{}_{2N+2}$. The zone $ZT_{2N+2}$ is the zone which connects the points $-V_{2N}$, S, $I_v$ and $I_{2N+1}$ to each other.

The transformation represented by FIGS. 12a and 12b yields the diagram of FIG. 25. Apart from the points already mentioned: E, ha', $-V_2$, $I_3$, $I''_1$ and $I_1$ for the input circuit and the points $-V_{2N}$, $I_V$, S, $-V_{2N+2}$, $I_{2N+1}$, the diagram comprises the points ia, ib, ic, id, ie, if, ig, ih, ii. The arcs interconnecting the pairs of points (ha", ia) (ia, ib) (ib, ic) (I3, ic) (id, $-V_2$) (ic, ie) (ie, if) (if, $I''_1$) respectively represent the transmission factors: "1", "1", "1", $-Z'_1{}^{-1}$, "1", "1", "1", $Z'^{-1}{}_1$, while the arcs interconnecting (ia, if) (ic, id) (id, ic) represent the factors: $-1$, "1", $-Z'_1{}'-Y_2$.

On the other hand, the arcs interconnecting the pairs of points ($-V_{2N}$, ig), (ig, ih) (ih, $-V_{2N+2}$) ($-V_{2N+2}$, ih) ($-V_{2N+2}$, ii) (ig, ii) (ii, $I_{2N+1}$) represent the factors: "1", "1", "1", $-Z_{2N+1} \cdot Y_{2N+2}$, "1", "$-1$", $(Z^{-1}2N+1)$; the arch which interconnects $i_v$ and $i_h$ may be cancelled.

In the same way as in FIG. 13 zones $ZTT_2$ and $ZTT_{2N}$ are formed which interconnect the points ib, ie for the first zone and the points ih, $-V_{2N+2}$ for the second zone, in order to apply the transformation represented by FIGS. 14a and 14b. the residual diagram, whose arcs interconnect the points E, ha', ha", ia, ib, ie, if, $I'_1$ and $I_1$, is modified by a transformation which is explained by means of FIGS. 26a, 26b and 26c. In FIG. 26a the points ha', ha" and ia are combined to a single point ja and the points $I'_1$, $I''_1$ and if to a point jb, allowance being made for the transmission factor which relates the points if to $I''_1$.

The transmission factors of the arcs interconnecting the points (ja, jb) on the one hand, and (jb, ja) on the other hand have the values $-1$ and $Z'^{-1}{}_1.R1$. By deleting the arc interconnecting the points (ja, jb) a loop is obtained to the point ja, which represents a transmission factor equal to $-Z'^{-1}{}_1 \cdot R_1$, while the arc interconnecting the points (jb, ja) has a transmission factor equal to $Z'^{-1} R1$. If the loop to point ja and to point jb is also deleted, the diagram shown in FIG. 26c is obtained, in which the transmission factors of the arcs interconnecting the pairs of points (ie, ja) and (ja, ib) respectively have the values $(Z'^{-1}{}_1 \cdot R1)$ and $1/(1 + Z'^{-1}{}_1 \cdot R1)$.

For the output circuit, the arc interconnecting the points ($-V_{2N+2}$, ih) is replaced by a loop to point ih. This loop is eliminated by changing the transmission factor corresponding to the arc (ih, $-V_{2N+2}$). The arc (iv, ih) then becomes redundant.

After these transformations the diagram of FIG. 27 is obtained, in which the quantities have been replaced by their values. The values of $Z'_1$ and $Y_{2N+2}$ are given by:

$$Z'_1 + \frac{1}{s\,C_1} \; Y_{2N+2} = 1/R_2$$

The diagram of FIG. 27, combined with that of FIG. 17b, yield the complete diagram of the high-pass filter. In order to realize the input and output circuits by means of switched-capacitance integrating networks, it is also necessary to apply the transformation shown in FIGS. 28a and 28b to the input circuit and the transformation shown in FIGS. 29a and 29b to the output circuit.

When a pair of points (P11, P12) is separated by an arc representing a transfer function of the type:

$$\frac{L_3}{1 + t_3 s}$$

(See FIG. 28a)
it may be transformed into a diagram (FIG. 28b) which apart from the points P11, P12 comprises an intermediate point ka. The arc which interconnects the pairs of points (P11, ka) represents a transmission factor $L_3$, the arc representing the pair of points (ka, P12) represents the factor $1/t_3 s$ and the arc connecting the point P12 to point ka the factor $-1$.

In FIG. 29a an arc interconnects a pair of points (P13, P14) and represents a transfer function of the type: $l_4 \cdot s/(1+t_4 s)$. FIG. 29b represents a diagram which is equivalent to that shown in the last-mentioned Figure. This diagram comprises the points P13 and P14 and an additional point kb. The arc which interconnects the pair of points (P13, kb) has a transmission factor equal to $l_4 s$; the arc which interconnects the pair of points (kb, P14) has a factor equal to $1/t_4 s$, and the arc which interconnects the pair of points (P14, kb) has the factor $-1$.

FIG. 30 represents the diagram by means of which the input the output circuits of a filter device in accordance with the diagram of FIG. 21 can be realized. The diagram of FIG. 30 also defines the structure of said circuits.

The input circuit comprises a switched-capacitance integrating network $RA_e$, and the output circuit comprises a network $RA_s$. The first pair of networks $RA_2$ and $RB_2$ and the last pair $RA_{2N}$ and $RB_{2N}$ of the high-pass filter are illustrate in such a way that the connections of the input and output circuits to the high-pass filter are shown. The circuit $RA_e$ comprises three inputs EA1, EA2 and EA3 and one output SA. The first input is connected to the input terminal on which the voltage E appears. The terminal EA2 is connected to the output SA of the network $RB_2$, the terminal EA3 to the output SA of said network $RA_e$. The output of the network $RA_e$ is also connected to the input EA1 of the network RA2 and to the input EB1 of the network RB2.

Between the first input EA1, which is connected to point E, and the output SA of the network $RA_e$ the transfer function is:

$$(-1) \times \frac{1}{s C_1 R_1}$$

Between the input EA2 and the output SA the transfer function is:

$$-s C_1 R_1 \times \frac{1}{s C_1 R_1} = -1$$

Between the input EA3 and the output SA the transfer function is:

$$-1 \times \frac{1}{s C_1 R_1}$$

The output circuit comprises a switched-capacitance network $RA_s$ having two inputs EA1 and EA2, and an output SA connected to the output terminal on which the output voltage S appears, to the input EB3 of the network $RB_{2N}$, and to the input EA2 of the network $RA_{2N}$. The input EA1 is connected to the output SA of the network and the input EA2 is connected to the output of the network $RB_{2N}$.

FIG. 31a shows the circuit diagram of the network $RA_e$. It comprises an operational amplifier $A_e$ provided with a feedback capacitor $CA^*_e$ which connects the output to its input. The output of amplifier $A_e$ constitutes the output SA of the network. A capacitor $\Gamma^*_e$ connects the $(-)$ input of the amplifier to the input EA3. There is also provided a capacitor $C^*_e$, of which a first electrode is connected to ground via a switch which is controlled by the voltage $\phi$ and of which the second electrode is connected to the input of the amplifier $A_e$ via a switch controlled by the voltage $\bar{\phi}$.

The first electrode is also connected to the terminal EA2 by a switch which is controlled by a voltage $\phi$. The second electrode is also connected to the terminal EA1 via a switch controlled by the voltage $\bar{\phi}$. The capacitance values of the capacitors are such that:

$$\frac{\Gamma^*_e}{CA_e} = 1$$

$$\frac{C^*_e}{CA^*_e} = \frac{T}{C_1 R_1}$$

A capacitor branch $C^*_e$ is provided which, when the voltage $\phi$ is at the level H, is charged by the voltage difference across the inputs EA2 and EA1, in such a way that the situation is the same as if instead of the voltage E the voltage $-E$ were present. This inversion has no influence on the filtration and in this way one capacitor may be dispensed with.

In FIG. 31b, which represents the circuit diagram of the network $RA_s$, the reference $A_s$ designates an operational amplifier. A capacitor $CA^*_s$ interconnects its output to its $(-)$ input. The output constitutes the output SA of the network. A capacitor $\Gamma^*_s$ interconnects the input EA1 and the $(-)$ input of the amplifier $A_s$. One electrode of a capacitor $C^*_s$ is connected to ground. The other electrode of the capacitor is connected to the terminal EA2 via a switch which is controlled by the voltage $\bar{\phi}$ and to the $(-)$ input via a switch which is controlled by the voltage $\phi$. The capacitance values of the capacitors are such that:

$$\frac{\Gamma^*_s}{CA^*_s} = 1$$

$$\frac{C^*_s}{CA^*_s} = \frac{T}{C_{2N+1} R_2}$$

Figure 32:
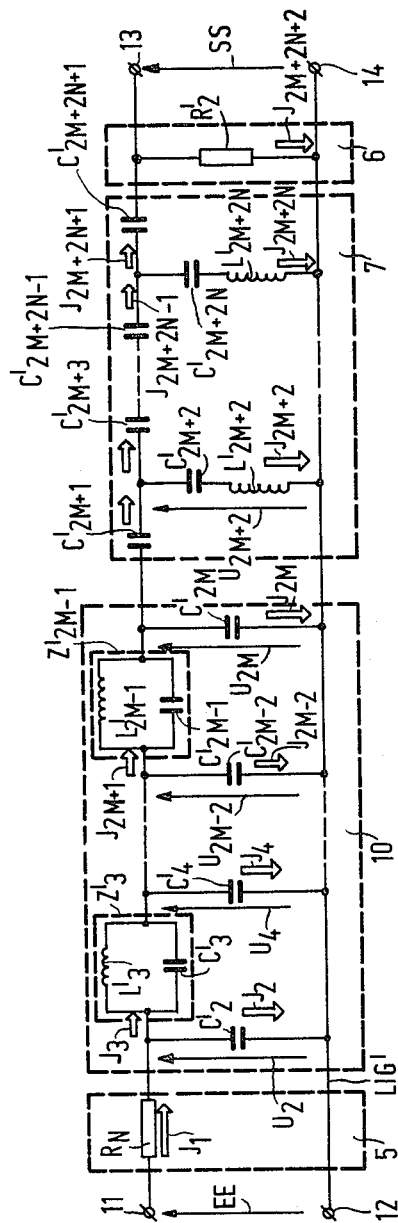
FIG. 32 represents an analog band-pass ladder filter.

FIG. 32 shows a circuit diagram of an analog bandpass ladder filter of the order 2M+2N. This filter comprises two sections: one constituting a high-pass filter 7, which has already been described, and the other section a low-pass filter 10. The voltage EE to be filtered is applied between the terminals 11 and 12. These terminals are connected to the inputs of the low-pass filter 10 via the input circuit 5 constituted by a resistor $R_{11}$ which connects the terminal 11 to a first input of the filter 10. The filtered voltage appears across the output terminals 13 and 14. These output terminals are connected to the outputs of the high-pass filter 7 via the output circuit 6 which is constituted by a resistor $R_{12}$. The filters 10 and 7 are cascaded, that is the outputs of the filter 10 are connected to the inputs of the filter 7.

The low-pass filter 10 comprises a capacitor $C'_{2'}$ of which one electrode constitutes the first input of the filter and of which the other electrode is connected to the terminal 12 via a line LIG'. The first electrodes of the other capacitors $C'_4 \ldots C'_{2M}$ are connected to the line. The second electrodes of the capacitors are interconnected by (M−1) parallel branches each constituted by an anti-resonant circuit formed by a coil and a capacitor in parallel. Thus, the second electrode of the capacitor $C'_2$ is connected to the second electrode of the capacitor $C'_4$ by a parallel connection constituted by a coil $L'_3$ and a capacitor $C'_3$, and the second electrode of the capacitor $C'_{2M-2}$ is connected to the second electrode of the capacitor $C'_{2M}$ via a circuit constituted by a coil $L'_{2M-1}$ and a capacitor $C'_{2M-1}$. The various parallel branches respectively have the impedances $Z'_3$, $\ldots Z'_{2M-1}$, and the capacitors $C'_2, C'_4, \ldots C'_{2M-2}$ have the admittances $Y'_2, Y'_4, \ldots, Y'_{2M-2}$.

The filter 7 has already been described with reference to FIG. 9. However, the references in the Figure have been changed in FIG. 32 in order to make them compatible with those used for the filter 10. In the modified references of FIG. 32, the indexes have been increased by 2 M relative to the original references of FIG. 9 and the letters have been marked with accents. There is the admittance $Y'_{2M+2k}$ of the series connection of the coil $L'_{2M+2k}$ and the capacitor $C'_{2M+2k}$ and the impedance $Z'_{2M=2k+1}$ of the capacitor $C'_{2M+2k+1}$. It is to be noted that "k" is an index which varies between 1 and M. Furthermore, the following electrical quantitities will be found:

the voltages $U_2, U_4 \ldots U_{2M-2}, U_{2M}, U_{2M+2}, U_{2M+2M}$ appearing across the circuits which respectively have the admittances: $Y'_2, Y'_4, \ldots, Y'_{2M-2}, Y'_{2M}, Y'_{2m+2}, \ldots Y'_{2M+2N}$ the currents $J_2, J_4, \ldots J_{2M-2}, J_{2M}, J_{2M+2}, J_{2M+2M}$ which flow through the circuits;

the voltages $U_1, U_3, \ldots U_{2M-1}, U_{2M+1}, U_{2M+3}, \ldots, U_{2M+2N-1}, U_{2M+2N+1}$ appearing across the circuits which respectively have the impedances R11, $Z_3, \ldots, Z_{2M-1}, Z_{2M+1}, Z_{2M+3} \ldots, Z_{2M+2N-1}, Z_{2M+2N+1}$;

and the currents $J_1, J_3, \ldots, J_{2M-1}, J_{2M+1}, J_{2M+3}, \ldots, J^{2M+2N-1}, J_{2m+2N+1}$ which flow through the impedances.

It has already been demonstrated that in accordance with the invention the high-pass filter 7 can be simulated by means of a first group of switched-capacitance integrating networks. Now it will be demonstrated that the low-pass filter 10 can be simulated by means of a second group of switched-capacitance networks. Like the input and output circuits the entire analog filter shown in FIG. 32 can be realized by means of switched-capacitance networks.

This will again be demonstrated by means of flow diagrams. First of all the following equations relating to the low-pass filter structure 10 are given.

$$J_1 = (EE - U_2) Z'_1{}^{-1} \tag{26}$$

$$J_{2i} = J_{2i-1} - J_{2i+1} \tag{27}$$

$$J_{2i+1} = U_{2i+1} \cdot Z'^{-1}{}_{2i+1} \tag{28}$$

$$U_{2i} = J_{2i} \cdot Y'_{2i}{}^{-1} \tag{29}$$

$$U_{2i+1} U_{2i+2} - U_{2i} = 1, \ldots, M. \tag{30}$$

In order to obtain the diagram of the high-pass filter, use is made of equations (18) and (19) in which the indices are increased by 2M and the notations are changed in accordance with the foregoing.

$$-U_{2M+2k} = 1 \times (-U_{2M-2k-2} + Z'_{2M+2k-1} \cdot J_{2M+2k-1}) \tag{31}$$

$$J_{2M+2k-1} = Y'_{2M+2k}(-1) \cdot (-U_{2M+2k}) + J_{2M+2k+1K} = 1, \ldots, N \tag{32}$$

Figure 33:
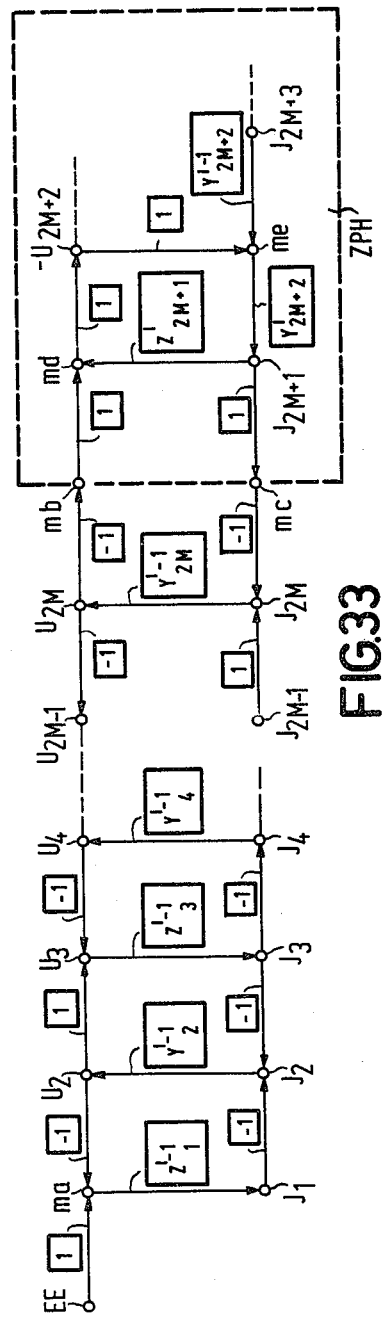
FIG. 33 shows a first flow diagram corresponding to said filter.

These equations are represented by the diagram of FIG. 33. Apart from the points representing the quantities: EE, $U_2$, $U_3$, $U_4$, $\ldots$, $U_{2M-1}$, $U_{2M}$, $-U_{2M+2}$, $\ldots$, $J_1$, $J_2$, $J_3$, $J_4$, $\ldots$, $J_{2M-1}$, $J_{2M}$, $J_{2M+1}$, $J_{2M+3}$, $\ldots$ there are other points bearing the references "ma", "mb", "mc", "md", "me". The arcs which interconnect the following pairs of points (EE, ma) ($U_2$, ma) ($U_2$, $U_3$) ($U_4$, $U_3$) (ma, $J_1$) ($J_1$, $J_2$) ($J_3$, $J_2$) ($J_3$, $J_4$)($J_4$, $U_4$) ($U_3$, $J_3$) ($J_2$, $U_2$) respectively represent the transmission factors: "1", −1, "1", −1, $Z'^{31}{}_{1}$, "1", −1, "1", $Y'^{31}{}_{4}$, $Z'^{-1}{}_{3}$, $Y'^{-1}{}_{2}$. The arcs which interconnect the pairs of points: ($U_{2M}$, $U_{2M-1}$) ($U_{2M}$, mb) (mc, $J_{2M}$) ($J_{2M-1}$, $J_{2M}$) ($J_{2M}$, $U_{2M}$) represent the transmission factors: −1, −1, −1, "1", $Y^{31}{}_{2M}$. A part of the transfer diagram shown in FIG. 33 is surrounded by a dashed line. This part ZPH represents the transfer diagram based on the analog structure in accordance with FIG. 9 and shown in FIG. 10. Nevertheless, the first elements of said diagram are shown in FIG. 33. The arcs which interconnect the pairs of points (mb, md) (md, $-U_{2M+2}$) ($-U_{2M+2}$, me) ($J_{2M+3}$, me) (me, $J_{2M+1}$) ($J_{2M+1}$, mc) ($J_{2M+1}$, md) correspond to the transmission factors: "1", "1", −1, $Y'^{-1}{}_{2M+2}$, $Y'_{2M+2}$, "1", $Z'_{2m+1}$.

FIG. 34 shows a first modification of the diagram of FIG. 33, which modification concerns the junction between the low-pass filter and the high-pass filter. The transformation shown in FIGS. 12a and 12b is applied to the zone ZPH. Apart from the circles $U_{2M-1}$, $U_{2M}$, mb, $J_{2M+3}$, $-U_{2M+2}$, mc, $J_{2M}$, $J_{2M-1}$, the diagram of FIG. 34 contains the points "na", "nb", "nc", "nd". The transmission factors relating the pairs of points ($U_{2M}$, $U_{2M-l}$), ($J_{2M-1}$, $J_{2M}$) ($U_{2M}$, mb) and (mc, $J_{2M}$) have already been specified. The arcs interconnecting the pairs of points (mb, na) (ma, nb) (nb, nc) (nc, nb) (nc, nd) and (na, nd) represent the transmission factors: "1", "1", "1", $-Z'_{2M+1} \cdot Y'_{2M+2}$, "1", "−1", and the arcs interconnecting the pairs ($J_{2M+3}$, mb) (nc, $-U_{2M+2}$) the factors $-Z'^{-1}{}_{2M+1}$, "1".

In a part of the diagram shown in FIG. 34 a zone ZTU is defined to which the transformations represented in FIGS. 35a, 35b and 35c will be applied. The zone interconnects the points $U_{2M-1}$, nb, nc and $J_{2M-1}$ to each other. FIG. 35a represents zone ZTU. In order to obtain the diagram of FIG. 35, it suffices to combine the points $U_{2M}$ and "na" to point Una and the circles $J_{2M}$ and "nd" to a point Jnd. In the diagram of FIG. 35b the values of the components are specified. Thus, the arcs interconnecting the pairs of points (Una, $U_{2M-1}$) (Una, nb) (Una, Jnd) (Jnd, Una) ($J_{2M-1}$, Jnd) (nc, Jnd) represent the transmission factors: −1, −1, $-sC'_{2M+1}$, $1/sC'_{2M}$, 1, $-sC'_{2M+1}$. The diagram of FIG. 35 is transformed into the diagram of FIG. 35c. In this diagram a point "ne" is inserted, the point Jnd not being included in the diagram. Thus, the new arcs which interconnect the pairs of points ($J_{2M-1}$, ne) (nc, ne) (ne, Una) represent the transmission factors: "1", $sC'_{2M+1}$, $1/s(C'_{2M}+C'_{2M+1})$.

In the diagram of FIG. 36a the impedances $Z'^{-1}{}_3$..., $Z'^{-1}{}_{2M-1}$, which occurred in FIG. 33, have also been split up in accordance with the values of their components $L'_3, C'_3 \ldots L'_{2M-1}, C'_{2M-1}$. Moreover, in comparison with FIG. 33 point "ma" is cancelled and so is point $J_1$. For reasons of consistency the points $J_2, J_3, \ldots J_{2M-1}$ have been multiplied by $R'$, which is an arbitrary quantity having the units of resistance. Thus, the transmission factors corresponding to the arcs which terminate in the points are multiplied by $R'$, the transmission factors associated with the arcs which issued from the points being divided by $R'$. On the other hand, the point bearing the reference Una in FIG. 35c is designated $U_{2M}$ in FIG. 36a.

In the diagram of FIG. 36a double branches are included between the pairs of points $(U_3, R'J_3), (U_5, R'J_5) \ldots (U_{2M-1}, R'J_{2M-1})$. A first arc which interconnects the pair $(U'_3, R'J_3)$ represents a transmission factor equal to $R'/sL'_3$, and a second arc represents a factor $sC'_3R'$. Similarly, the first arc which interconnects the pair of points $(U_5, R'J_5)$ represents a transmission factor $R'/sL'_5$, and the second arc a factor $sC'_5R'$. Finally, the arcs which interconnect the pair $(U_{2M-1}, R'J_{2M-1})$ respectively represent the factors $R'/sL'_{2M-1}$ and $sR'C'_{2M-1}$. The arcs which interconnect the pairs (EE, $R'J_2$) $(R'J_2, U_2)$ $(U_2, R'U_2)$ $(R'J_3, R'J_2)$ and $(U_2, U_3)$ respectively represent the transmission factors: $R'/R_{11}$, $1/sC'_2R'$, $R'/R_{11}$, $-1$, $1$. The arcs which interconnect the pairs $(U_4, U_3)$ $(R'J_3, R'J_4)$ $(R'J_4, U_4)$ $(U_4, U_5)$ $(R'J_5, R'J_4)$ $(R'J_5, R'J_6)$ $(U_6, U_5)$ represent the transmission factors: $-1$, $1$, $1/sC'_4R'$, $1$, $-1$, $1$, $-1$. The arcs interconnecting the pairs $(U_{2M}, U_{2M-1})$ $(R'J_{2M-1}, \text{ne})$ (nc, ne) (ne, $U_{2M}$) $(U_{2M}, \text{nb})$ represent the transmission factors: $-1$, $1/R'$, $sC'_{2M+1}$, $1/s(C'_{2M}+C'_{2M+1})$, $-1$.

In order to obtain the final diagram, which can be realized by means of switched-capacitance integrating networks, the terminating point of the arcs having the origins $U_3, U_5, U_{2M-1}$ and having the transmission factors $sC'_3R', sC'_5R', \ldots, sC'_{2M-1}R'$, are changed. The arcs are divided into two arcs. Thus, for the starting point $U_3$ two terminating points are obtained, point $R'J_2$ and point $R'J_4$. The starting point $U_5$ corresponds to two terminating points $R'J_4$ and $R'J_6$. The transmission factors of the arcs (represented by small crosses in FIG. 36) for the pairs of points $(U_3, R'J_2)$ $(U_3, R'J_4)$ $(U_5, R'J_4)$ and $(U_5 R'J_6)$ are respectively $-sC'_3R'$, $sC'_3R'$, $-sC'_5R'$, $sC'_5R'$. Starting from these last-mentioned arcs represented by crosses, new arcs are formed which no longer pass through the starting points $(U_3, U_5 \ldots)$ of the arcs represented by the crosses. Then the flow diagram of FIG. 36b is obtained, which only relates to the low-pass filter structure. As a result of the changes to the arcs, only the points $U_2, U_4, U_6 \ldots$ are left. The points "pa", "pb", "pc", "pd", "pe", "pf", and "pg" are now formed. Two arcs interconnect the points $(U_2, pg)$ which respectively represent the transmission factors: $-R'/R_{11}$, $-sC'_3R'$, two arcs interconnect the points $(U_4, pe)$ which respectively represent the transmission factors $-sC'_3R$ and $-sC'_5R'$, and the two arcs which interconnect the points $(U_6, pc)$ respectively represent the transmission factors $-sC'_5R'$ and $-sC_7R'$. The vertical arcs interconnecting the pairs of points (pg, $U_2$) (pe, $U_4$) (pc, $U_6$) (pa, pf) (pb, pd) respectively represent the transmission factors: $1/sC'_2R'$, $1/sC'_4R$, $1/sC'_6R'$, $R'/sl'_3$, $R'/sL'_5$. The horizontal arcs interconnecting the pairs of points $(U_2, pa)$ $(U_4, pa)$ $(U_4, pb)$ $(U_6, pb)$ (pd, pc) (pd, pe) (pf, pe) (pf, pg) (EE, pg) respectively represent the transmission factors: "1", $-1$, "1", $-1$, "1", $-1$, "1", $-1$, $-R'/R_{11}$. The oblique arcs interconnecting the pairs of points $(U_2, \text{pe})$ $(U_4, \text{pc})$ $(U_6, \text{pe})$ $(U_4, \text{pg})$ represent the transmission factors: $sC'_3R'$, $sC'_5R'$, $sC'_5R'$, $sC'_3R'$. In order to obtain the final flow diagram the transformation represented in FIGS. 37a and 37b is applied. This transformation is applied to the arcs which interconnect the points $U_2$, pg, the points $U_4$, pe and the points $U_6$, pc.

FIG. 37a shows a flow diagram comprising three points P20, P21 and P22. The arcs which interconnect the pairs (P20, P21) (P21, P22) (P22, P21) respectively represent transmission factors: $1$, $1/st_{10}$, $-st_{11}$. The equivalent diagram of FIG. 37b only comprises the points P20 and P22 and the arc which interconnects the pair (P20, P22) represents a transmission factor $1/s(t_1+t_2)$. It is to be noted that my means of this transformation a derivation can be eliminated, represented by "s", which cannot be realized by means of switched-capacitance networks.

In order to obtain the final flow diagram, the electrical quantities corresponding to points $\ldots U_{2i}, \ldots U_{2M}$ are respectively multipled by: $\ldots (-1)^{i+1}, \ldots (-1)^{M+1}$. Consequently, the transmission factors corresponding to arcs which are connected to point $V_{2i}$ are multiplied by $(-1)^{i+1}$, which is valid for $i=1, 2, \ldots, M$.

Figure 38C:
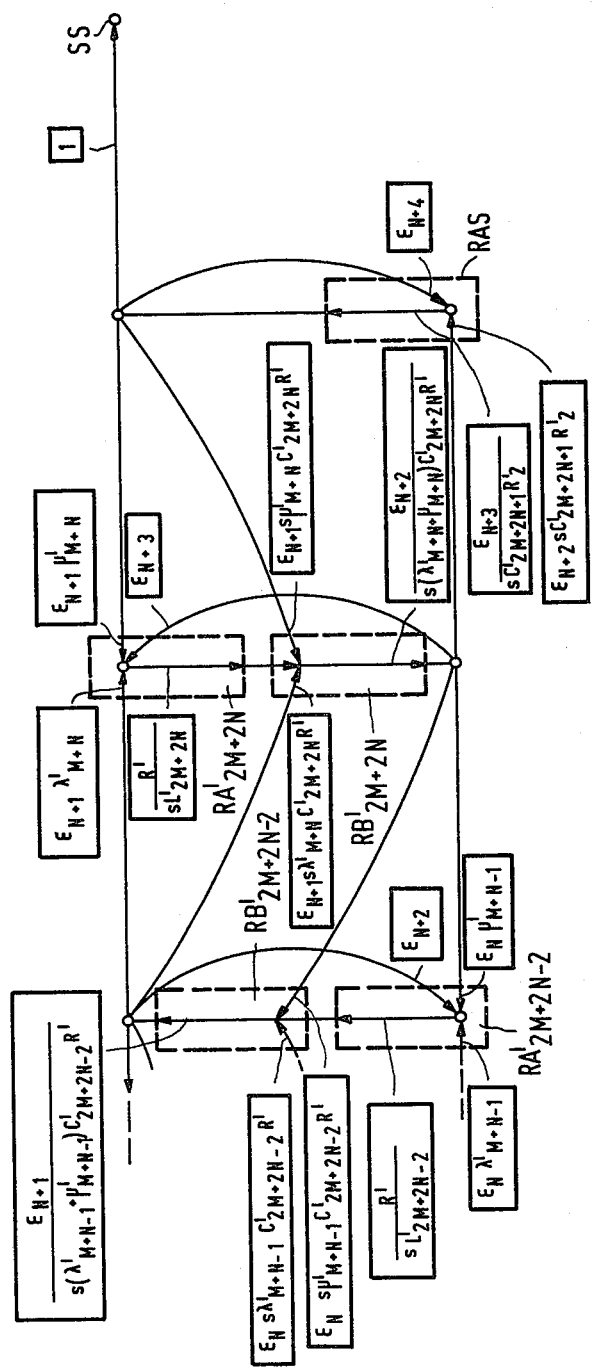

The final flow diagram is shown in FIGS. 38a, 38b and 38c. FIG. 38a represents the flow diagram corresponding to the input circuit 5 with the first elements of the low-pass filter 10. FIG. 38b represents the flow diagram corresponding to the junction between the low-pass filter 10 and the high-pass filter 7, and FIG. 38c shows the flow diagram corresponding to the output circuit 6, with the last elements of the high-pass filter 7. The diagram of FIG. 38c may be compared with the right-hand part of FIG. 30.

In addition to the first group of switched-capacitance integrating networks $RA'_{2M+2}$, $RB'_{2M+2}$, $RA'_{2M+4}$, $RB'_{2M+4}, \ldots, RA'_{2M+2N-2}$, $RB'_{2M+2N-2}$, $RA'_{2M+2N}$, $RB'_{2M+2N}$ and a first switched-capacitance integrating network at the output RA's, the filter device in accordance with the invention defined by the diagrams of FIGS. 38a, 38b and 38c comprise a second group of switched-capacitance integrating networks with the capacitances $RPB_2$, $RPB_3$, $RPB_4$, $RPB_5, \ldots, RPB_{2M-2}$, $RPB_{2M-1}$, $RPB_{2M}$, of which the network $RPB_2$ constitutes a second input network.

The network $RPB_2$ comprises four inputs $EPB_1$, $EPB_2$, $EPB_3$ and $EPB_4$ and an output $SPB$ which corresponds to point $U_2$. The input $EPB1$ receives the voltage EE to be filtered, the input $EPB2$ is connected to the output of the network $RPB_2$, the input $EPB3$ to the output of the network $RPB_4$ and the input $EPB4$ to the output of the network $RPB_3$. The network $RPB_2$ has the following transfer functions:

between the first input EPB1 and the output:

$$\frac{R'}{R_{11}} \times \frac{1}{s(C_2+C_3)R'} = \frac{1}{sR_{11}(C_2+C_3)}$$

between the second input EPB2 and the output:

$$\frac{R'}{R_{11}} \times \frac{1}{s(C_2+C_3)R'} = -\frac{1}{sR_{11}(C_2+C_3)}$$

between the third input EPB3 and the output:

$$(-sC_3R') \times \frac{1}{s(C_2 + C_3)R'} = -\frac{C_3}{C_2 + C_3}$$

between the fourth input EPB4 and the output:

$$(-1) \cdot \frac{1}{s(C_2 + C_3)R'} = -\frac{1}{s(C_3 + C_3)R'}$$

The network RPB3 comprises three inputs EPB1 and EPB2. The input EPB1 is connected to the output of the network RPB2, the input EPB2 to the output of the network RPB4. The network RPB3 has the following transfer functions:
between the input EPB1 and the output:

$$(1) \cdot (R'/sL_3) = R'/sL_3$$

between the input EPB2 and the output:
$$(1) \cdot (R'/sL'_3) = R'/sL'_3.$$

The network RPB4 comprises four inputs EPB1, EPB2, EPB3 and EPB4 and one output SPB which corresponds to point $-U_4$. The first input EPB1 is connected to the output of the network RPB3, the second input EPB2 to the output of the network RPB2, the third input EPB3 to the network RPB6 (not shown), the fourth input EPB4 to the output of the network RPB5. The network RPB4 has the following transfer functions:
between the input EPB1 and the output:

$$(-1) \cdot \frac{1}{s(C_3 + C_4 + C_5)R'} = -\frac{1}{s(C_3 + C_4 + C_5)R'}$$

between the input EPB2 and the output:

$$(-sC_3R') \cdot \frac{1}{s(C_3 + C_4 + C_5)R'} = -\frac{C_3}{C_3 + C_4 + C_5}$$

between the input EPB3 and the output:

$$(-sC_5R') \cdot \frac{1}{s(C_3 + C_4 + C_5)R'} = -\frac{C_5}{C_3 + C_4 + C_5}$$

between the input EPB4 and the output:

$$(-1) \cdot \frac{1}{s(C_3 + C_4 + C_5)R'} = -\frac{1}{s(C_3 + C_4 + C_5)R'}$$

The transfer functions of the other networks as well as their connections are easy to derive. However, for the network RPB$_{2M}$, which is connected to the networks RA$'_{2M+2}$ and RB$'_{2M+2}$, which form part of the first group of switched-capacitance networks which are intended to simulate a high-pass filter structure, more details are given.

The network RPB$_{2M}$ comprises three inputs EPB1, EPB2 and EPB3 and one output SPB which corresponds to point $\epsilon_M.U_{2M}$, $\epsilon_j$ being defined by the relation:

$\epsilon_j = (-1)^{j+1}$ where j is an integer.

The first input EPB1 of the network RPB$_{2M}$ is connected to the output of the network RPB$_{2M-1}$, the second input EPB2 to the output of the network RPB$_{2M-2}$, the third input EPB3 to the output of the network RB$'_{2M+2}$.

The network RPB$_{2M}$ has the following transfer functions:
between the input EPB1 and the output:

$$(1) \cdot \frac{1}{(C_{2M-1} + C_{2M} + C_{2M+1})R'}$$

between the input EPB2 and the output:

$$(-sC_{2M-1}R') \cdot \frac{1}{s(C_{2M-1} + C_{2M} + C_{2M+1})} =$$
$$-\frac{C_{2M-1}}{C_{2M-1} + C_{2M}C_{2M+1}}$$

between the input EPB3 and the output:

$$(-sC_{2M+1}R') \cdot \frac{1}{s(C_{2M-1} + C_{2M} + C_{2M+1})} =$$
$$-\frac{C_{2M+1}}{C_{2M-1} + C_{2M}C_{2M+1}}$$

The output of the network RPB$_{2M}$ is connected to the input EPB3 of the network RPB$_{2M-1}$, to the input EPB2 of the network RPB$_{2M-1}$, to the input EA'1 of the network RA$'_{2M+2}$ and to the input EB'1 of the network RB$'_{2M+2}$.

The transfer functions of the network of the first group can readily be determined by means of the functions already defined in which the indices are incremented by 2M and in which the function $\epsilon_{k+4}$ (FIGS. 38b and 38c) is substituted for $(-1)^k$.

Figure 39:
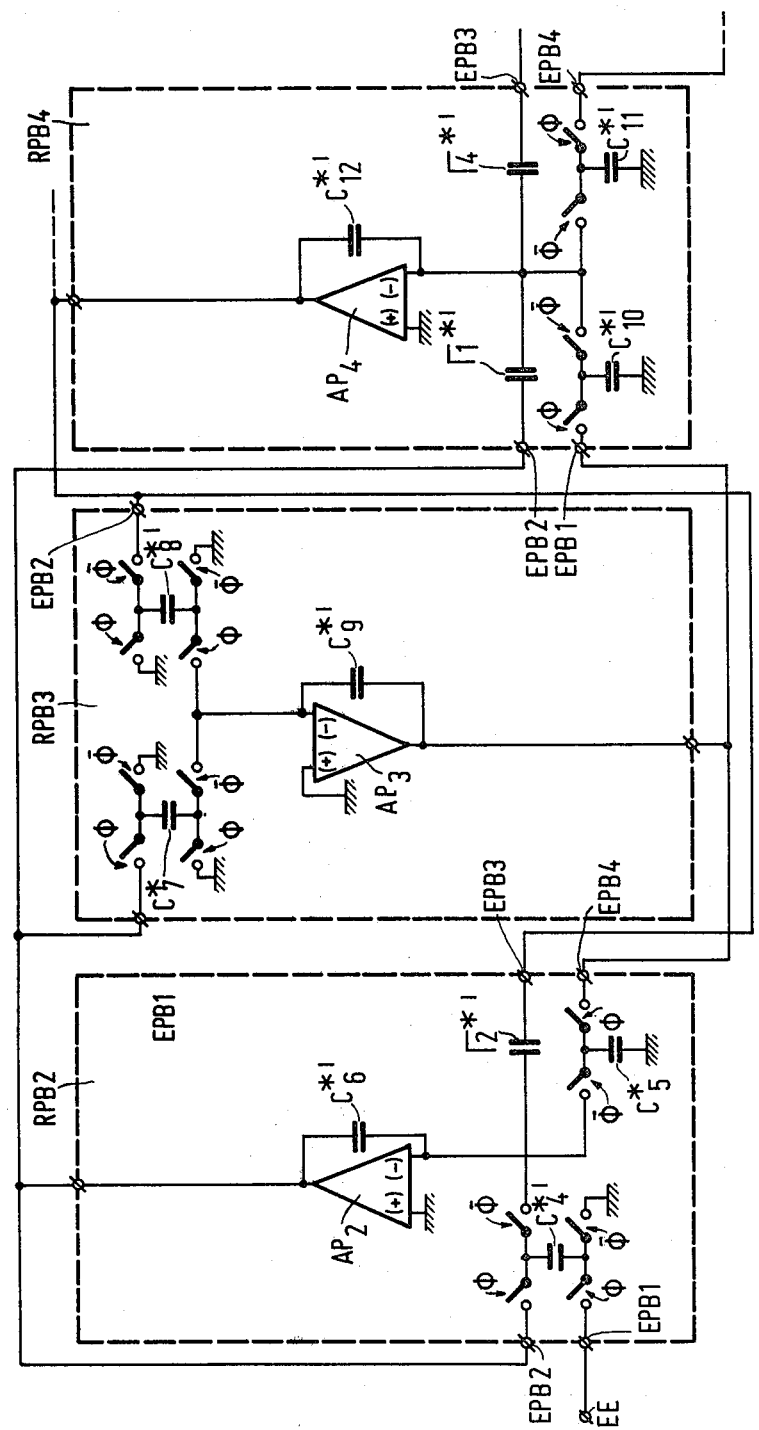
FIGS. 39, 40 and 41 show the circuit diagrams of the switched-capacitance integrating networks forming part of the device shown in FIG. 38.

FIG. 39 shows the networks RPB2, RPB3 and RPB4 in detail.

The network RPB2 is formed by means of an operational amplifier AP2 whose output constitutes the output of the network. A capacitor $C^{*'}_6$ interconnects the output and the (—) input of said amplifier. There is provided a capacitor $C^{*'}_4$ whose first electrode is connected to the input EPB1 via a switch which is controlled by the voltage $\phi$ and to earth via another switch controlled by the voltage $\bar\phi$, and whose second electrode is connected to the input EPB2 via a switch controlled by the voltage $\phi$ and to the (—) input of the amplifier AP2 via a switch controlled by the voltage $\bar\phi$. A capacitor $E^{*'}_2$ connects the (—) input of the amplifier AP2 to the inputs EPB3. A first electrode of the capacitor $C^{*'}_5$ is connected to ground, the other electrode being connected to the input EPB4 via a switch controlled by the voltage $\phi$ and to the (—) input via a switch controlled by the voltage $\bar\phi$.

The capacitance values are such that:

$$C^{*}_4/C^{*}_6 = \frac{T}{(C_3 + C_3)R11} \quad (33)$$

$$C^{*}_5/C^{*}_6 = \frac{T}{(C_3 + C_3)R'} \quad (33)$$

$$\Gamma^{*'}_2/C^{*}_6 = \frac{C_3}{C_2 + C_3} \quad (35)$$

The network RPB3 is formed by means of an operational amplifier AP3 whose output constitutes the output of the network. A feedback capacitor $C^{*'}_9$ couples the output to the (—) input of said amplifier AP3. One electrode of a capacitor $C^{*'}_7$ is connected to ground via a switch controlled by the voltage $\phi$ and to the $(-)$ input of the amplifier AP3 via a switch controlled by the voltage $\bar\phi$. The other electrode of the capacitor $C^{*'}_7$ is connected to the terminal EPB1 via a switch controlled by the voltage $\bar\phi$ and to ground via a switch controlled by the voltage $\phi$. Similarly, one of the electrodes of a capacitor $C^{*'}_8$ is connected to ground via a switch controlled by the voltage $\bar\phi$ and to the $(-)$ input of the amplifier AP3 via a switch controlled by the voltage $\phi$, while the other electrode is connected to the input EPB2 via a switch controlled by the voltage $\bar\phi$ and to ground via a switch controlled by the voltage $\phi$. The capacitance values of the capacitors are such that:

$$C^{*'}_7/C^{*'}_9 = C^{*'}_8/C^{*'}_9 = R'T/L'_3 \tag{36}$$

Generally speaking, all the networks RPB with an odd index (2h+1) satisfy:

$$\frac{C^{*'}_{6h+1}}{C^{*'}_{6h+3}} = \frac{C^{*'}_{6h+2}}{C^{*'}_{6h+3}} = R'T/L_{2h+1} \tag{37}$$

$$h = (1, 2, \ldots, M = 1)$$

The network RPB4 comprises an operational amplifier AP4 provided with a feedback capacitor $C^{*'}_{12}$ which interconnects its $(-)$ input to its output. One electrode of a capacitor $C^{*'}_{10}$ is connected to the terminal EPB1 via a switch controlled by a voltage $\phi$ and to the $(-)$ input via a switch controlled by a voltage $\bar\phi$, and the other electrode of the capacitor is connected to ground. One electrode of a capacitor $C^{*'}_{11}$ is connected to the input EPB4 via a switch controlled by the voltage $\phi$ and to the $(-)$ input of the amplifier AP4 via a switch controlled by the voltage $\bar\phi$.

Two capacitors $E^{*'}_1$, $E^{*'}_4$ interconnect the $(-)$ input of the amplifier AP4 to the inputs EPB2 and EPB3 respectively. The capacitance values of the capacitors are such that:

$$C^{*'}_{10}/C^{*'}_{12} = C^{*'}_{11}/C^{*'}_{12} = T/R'(C'_3 + C'_4 + C'_5) \tag{38}$$

$$E^*1/C^{*'}_{12} = C'_3/(C'_3 + C'_4 + C'_5) \tag{39}$$

$$E^*4/C^{*'}_{12} = C'_3/(C'_3 + C'_4 + C'_5) \tag{40}$$

Generally speaking, the networks RPB$_{2h}$ with an even index satisfy:

$$C^{*'}_{6h-2}/C^{*'}_{6h} = C^{*'}_{6h-1}/C^{*'}_{6h} = \frac{T}{R'(C'_{2h-1} + C'_{2h} + C'_{2h+1})} \tag{41}$$

$$E^{*'}_{2h-3}/C^{*'}_{6h} = C'_{2h-1}/(C'_{2h-1} + C'_{2h} + C'_{2h+1}) \tag{42}$$

$$E^{*'}_{2h}/C^{*'}_{6h} = C'_{2h+1}/(C'_{2h-1} + C'_{2h} + C'_{2h+1}) \tag{43}$$

These values are valid for $2 < h < M$.

Figure 40:
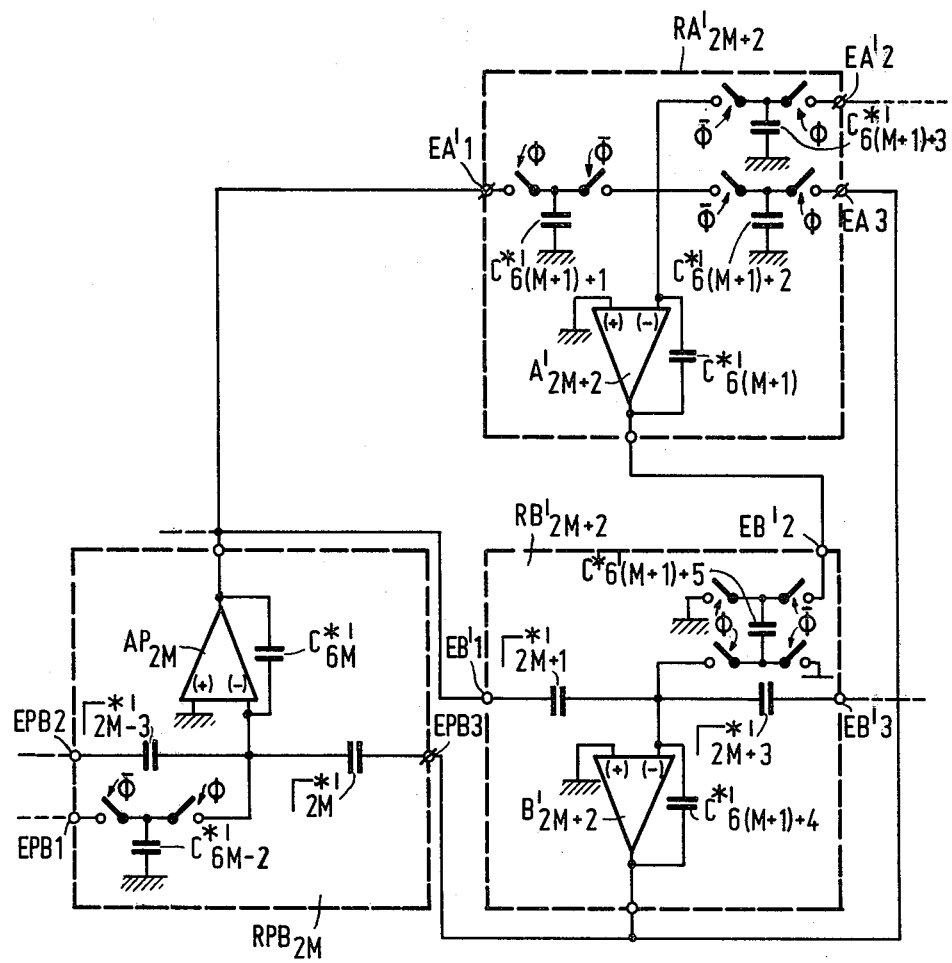

FIG. 40 represents the structure of the switched-capacitance networks RPB$_{2M}$, RA$'_{2M+2}$ and RB$'_{2M+2}$ in detail.

The network RPB$_{2M}$ is formed by means of an operational amplifier AP$_{2M}$ provided with a feedback capacitor $C^{*''}_{6M}$ for interconnecting its $(-)$ input to its output. One electrode of a capacitor $C^*_{6M-2}$ is connected to the $(-)$ input of the operational amplifier AP$_{2M}$ via a switch controlled by a voltage $\phi$ and to the input EPB1 via a switch controlled by the voltage $\bar\phi$. The other electrode of the capacitor is connected to ground. Two capacitors $\Gamma^{*'}_{2M-3}$ and $\Gamma^{*'}_{2M}$ interconnect the $(-)$ input to the inputs EPB2 and EPB3, respectively. The capacitance values of the capacitors are given by the formulas (41) (42) and (43) in which h=M.

The network RA$'_{2M+2}$ is formed by means of an operational amplifier A$'_{2M+2}$ provided with a feedback capacitor $C^{*'}_{6(M+1)}$ which interconnects its output to its $(-)$ input. The first electrode of a capacitor $C^*_{6(M+1)+1}$ is connected to the input EA$'1$ via a switch controlled by the voltage $\phi$ and to the $(-)$ input of the amplifer A$'_{2M+2}$ via a switch controlled by the voltage $\bar\phi$, the other electrode of the capacitor being connected to ground. The first electrode of a capacitor $C^{*'}_{6(M+1)+3}$ is connected to the input EA$'2$ via a switch controlled by the voltage $\phi$ and to the $(-)$ input of the amplifier A$'_{2M+2}$ via a switch controlled by the voltage $\bar\phi$, the other electrode being connected to ground. The first electrode of a capacitor $C^{*'}_{6(M+1)+2}$ is connected to the input EA$'3$ via a switch controlled by the voltage $\phi$ and to the $(-)$ input of the amplifier A$'_{2M+2}$ via a switch controlled by the voltage $\bar\phi$.

The network RB$'_{2M+2}$ is formed by means of an amplifier B$'_{2M+2}$ comprising a feedback capacitor $C^{*'}_{6(M+1)+4}$ which connects its $(-)$ input to its output. Two capacitors $\Gamma^{*'}_{2M+1}$ and $\Gamma^{*'}_{2M+3}$ respectively interconnect the inputs EB$'_1$ and EB$'_3$ to the $(-)$ input of the last-mentioned amplifier. The first electrode of a capacitor $C^{*'}_{6(M+1)+5}$ is connected to the input EB$'_2$ via a switch controlled by the voltage $\phi$ and to earth via a switch controlled by the voltage $\bar\phi$. The other electrode of the capacitor is connected to ground via a switch controlled by the voltage $\bar\phi$ and to the $(-)$ input via a switch controlled by the voltage $\phi$. The capacitance values are determined in the same way as those of the capacitances of the networks RA$_{2k}$ and RB$_{2k}$ shown in FIG. 5.

The output of the network RPB$_{2M}$, that is the output of the amplifier AP$_{2M}$, is connected to the input EA$'_1$ of the network RA$'_{2M+2}$ and to the input EB$'_1$ of the network RB$'_{2M+2}$ and also the inputs EPB2 and EPB3 of the networks RPB$_{2M-1}$ and RPB$_{2M-2}$ (not shown in FIG. 40). The output of the network RA$'_{2M+2}$, that is the output of the amplifier A$'2M+2$ is connected to the input EB$'_2$ of the network RB$'_{2M+2}$. The output of the last-mentioned network is connected to the input EPB3 of the network RPB$_{2M}$.

Figure 41:
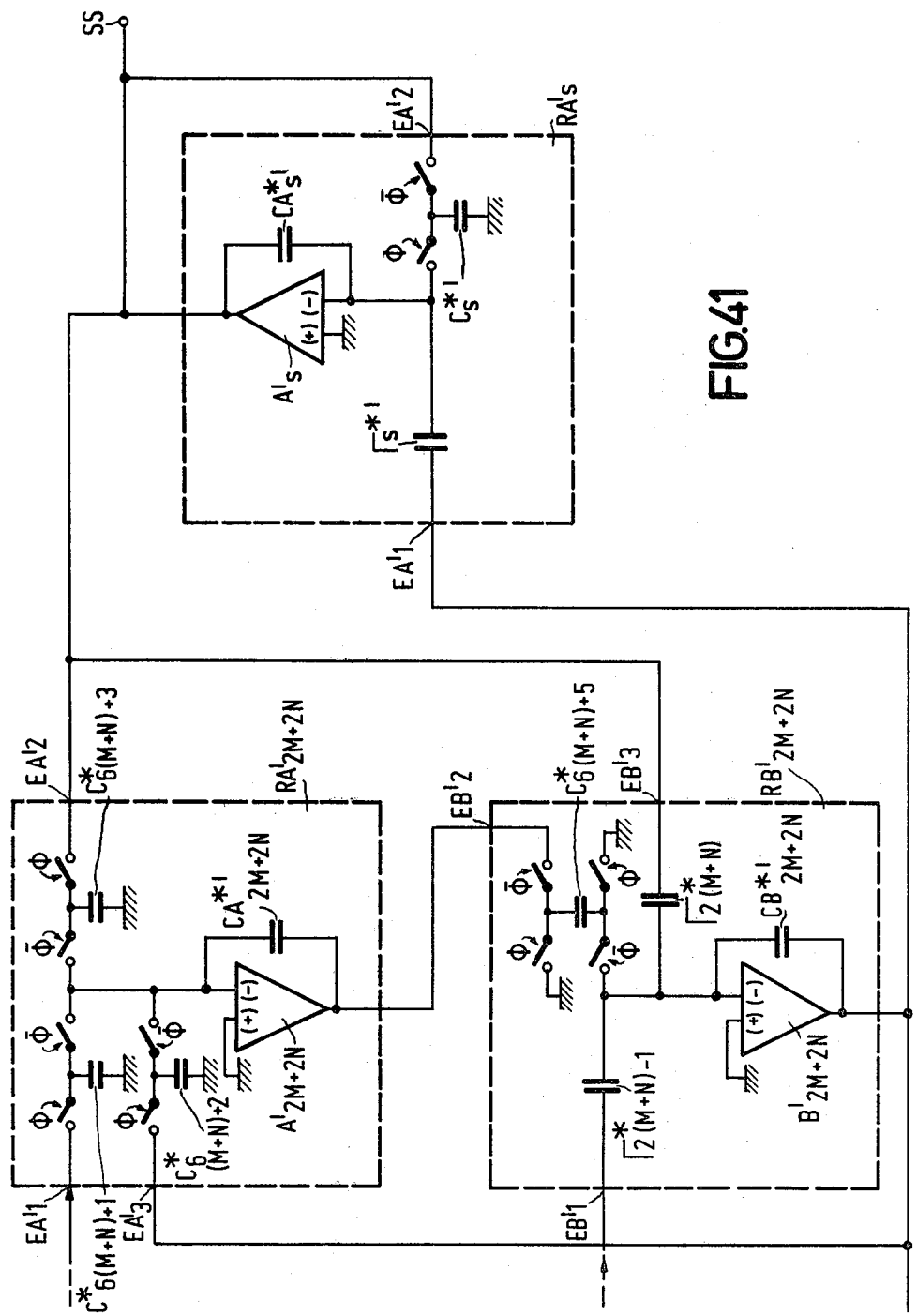

FIG. 41 shows in detail the structure of the switched-capacitance output network RA$'_s$ which simulates the output circuit 6 of FIG. 32, as well as the last pair of networks RA$'_{2M+2N}$ and RB$'_{2M+2N}$ of the first group which simulates the high-pass filter structure.

The structure of the networks RA$'_{2M+2N}$ and RB$'_{2M+2N}$ is identical to those of the networks RA$_{2K+2}$ and RB$_{2K+2}$ shown in FIG. 5.

The network RA$'_s$ has a structurre identical to that of the network RA$_s$ shown in FIG. 31b.

In order to obtain the references of the capacitances of the networks RA$'_{2M+2N}$ and RB$'_{2M+2N}$, the index k of the capacitances of the afore-mentioned networks of FIG. 5 is replaced by M+N and the references are marked with an accent.

For the network RA$'_s$ all references are provided with an accent.

The output of the network RA$'_s$ is connected to the terminal on which the filtered voltage SS appears and also to the inputs EA$'_2$ and EA$'_3$ of the networks RA$'_{2M+2N}$ and RB$'_{2M+2N}$. The input EA$'_1$ of the network RA$'s$ is connected to the output of the network RB$'_{2M+2N}$, while the input EA$'_2$ of the first-mentioned network is connected to its own output.

Figure 42:
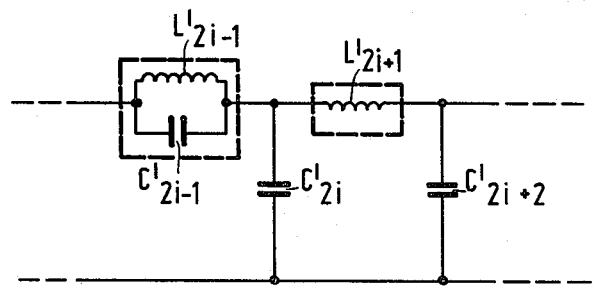

It is evident that one or more of the capacitors $C'_{2i+1}$ in the low-pass filter 10 may be dispensed with. FIG. 42 shows the case in which the capacitor $C'_{2i+1}$ has been removed, which corresponds to a capacitor with a capacitance value zero. The parallel branch is then reduced to a single coil $L'_{2i+1}$ in such a way that the attenuation peak is transferred to the frequency infinity. If the capacitor $C'_{2i+1}$ is connected in parallel with coil $L'_{2i+1}$ the attenuation peak will be situated at the frequency $\frac{1}{2}\pi\sqrt{L'_{2i+1} \cdot C'_{2i+1}}$.

Figure 43:
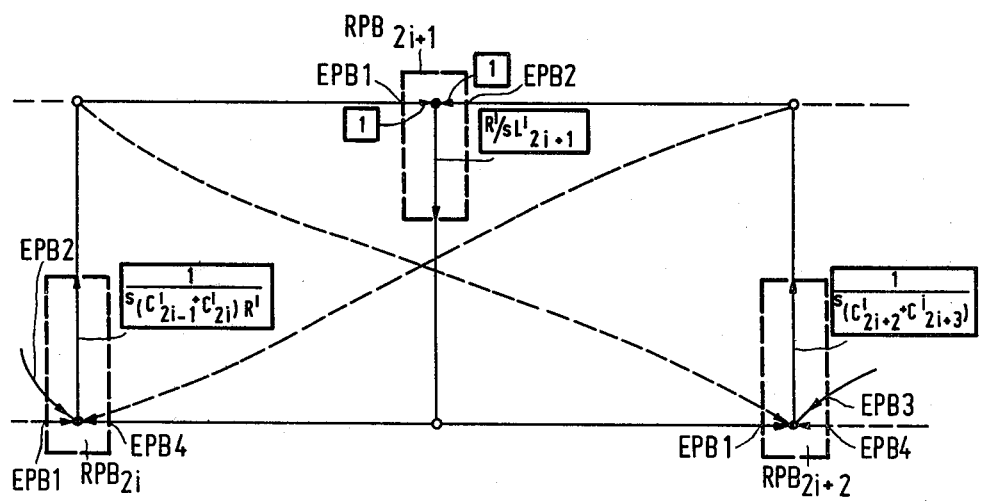
FIG. 43 shows the flow diagram corresponding to the filter of FIG. 42, which can be realized by means of switched-capacitance networks.

In order to simulate the filter structure shown in FIG. 42, using the flow diagrams of FIGS. 38a and 38b, $C'_{2i+1}$ is made to approximate zero. Then the diagram of FIG. 43 is obtained. In this diagram the arcs which are cancelled, because $C'_{2i+1}$ is assumed to be zero, are represented by dotted lines. Thus, the network $RPB_{2i}$ has only three inputs EPB1, EPB2 and EPB4, while the network $RPB_{2i+1}$ also has three inputs EPB1, EPB3 and EPB4.

Figure 44:
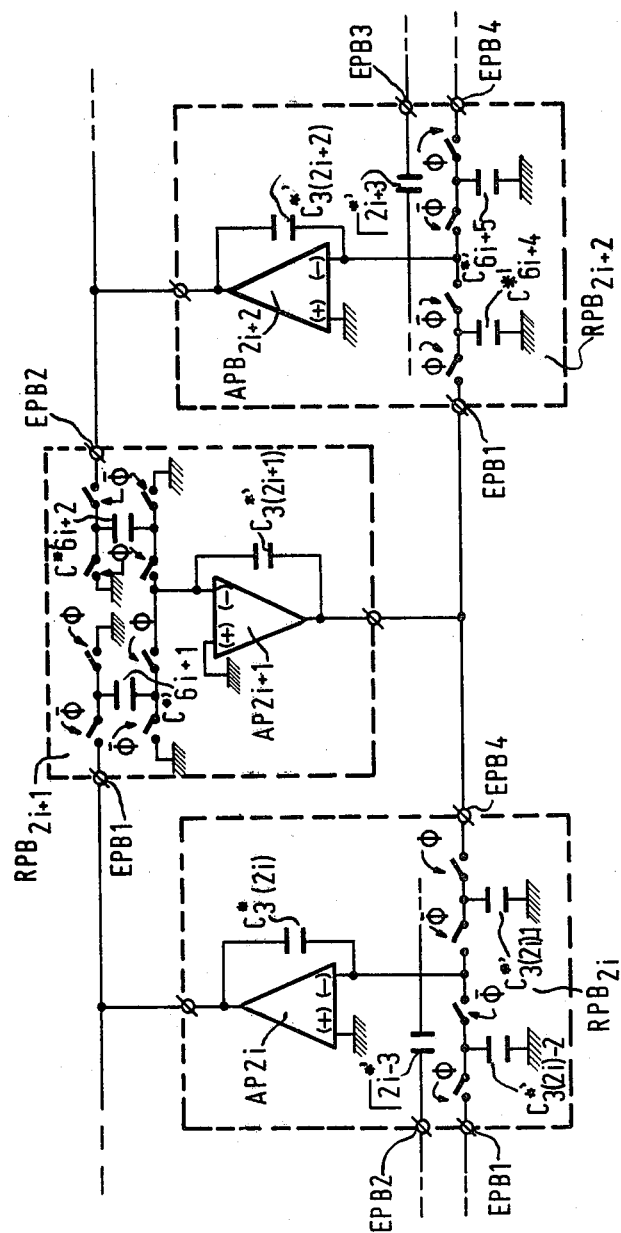
FIG. 44 shows the circuit diagram of said switched-capacitance networks.

FIG. 44 shows the circuit diagram corresponding to the flow diagram of FIG. 43. Now the realization of the networks $RPB_{2i}$ and $RPB_{2i+2}$ will be discussed.

The network $RPB_{2i+1}$ has a structure identical to that of the network $RPB_3$ shown in FIG. 39, except that the capacitors $C^{*\prime}_7$, $C^{*\prime}_8$, $C^{*\prime}_9$ should be replaced by the capacitors $C^{*\prime}_{6i+1}$, $C^{*\prime}_{6i+2}$, $C^{*\prime}_{6i+3}$, respectively.

The network $RPB_{2i}$ has a structure similar to that of the network $RPB_4$. The main difference between the two networks is that the terminal EPB3 of the network $RPB_4$ is not used and therefore the capacitor connected thereto need not be present. The capacitors $C^{*\prime}_{10}$, $C^{*\prime}_{11}$, $C^{*\prime}_{12}$, $\Gamma^{*\prime}_1$ should be replaced by $C^{*\prime}_{6i-2}$, $C^{*\prime}_{6i-1}$, $C^{*\prime}_{6i}$, $\Gamma^{*\prime}_{2i-1}$.

The network $RPB_{2i+2}$ also has a structure similar to that of the network $RPB_4$. In this case the terminal EPB2 with its associated capacitor is not used. The capacitors $C^{*\prime}_{10}$, $C^{*\prime}_{11}$, $C^{*\prime}_{12}$, $\Gamma^{*}_4$ should be replaced by $C^{*\prime}_{6i+4}$, $C^{*\prime}_{6i+5}$, $C^{*\prime}_{6i+6}$ and $\Gamma^{*}_{2i+2}$.

What is claimed is:

1. A filter device including a first group of switched-capacitance integrating networks for simulating an analog high-pass ladder filter comprising a first and a second input terminal, a first and a second output terminal, a plurality of series-connected capacitors . . . , $C_{2k-1}$, $C_{2k+1}$, $C_{2k+3}$, . . . interconnecting the first input terminal to the first output terminal, a plurality of admittances . . . $Y_{2k}$, $Y_{2k+2}$, . . . each having one end electrically connected to electrically-connected electrodes of a respective pair of said capacitors and having the other end electrically-connected to the second input and output terminals, said admittances comprising series-connected capacitors, inductors $C_{2k}$, $L_{2k}$; $C_{2k+2}$, $L_{2k+2}$; respectively said first group comprising a plurality of pairs of switched-capacitance integrating networks $RB_{2k-2}$, $RA_{2k-2}$; $RA_{2k}$, $RB_{2k}$; $RB_{2k+2}$, $RA_{2k+2}$; each network having three inputs and one output; the first input of the network $RA_{2k}$ being connected to the output of the network $RB_{2k-2}$, the second input to the output of the network $RB_{2k+2}$, and the third input to the output of the network $RB_{2k}$; the first input of the network $RB_{2k}$ being connected to the output of the network $RB_{2k-2}$, the second input to the output of the network $RA_{2k}$ and the third input to the output of the network $RB_{2k+2}$; the network $RA_{2k}$ having the following transfer functions:

$$\frac{(-1)^{k-1}\lambda_k R}{s L_{2k}}$$

between the first input and the output;

$$\frac{(-1)^{k+1}\mu_k R}{s L_{2k}}$$

between the second input and the output; and $$\frac{(-1)^{k+1} R}{s L_{2k}}$$

between the third input and the output; the network $RB_{2k}$ having the following transfer functions:

$$-\frac{C_{2k-1}}{C_{2k-1} + C_{2k+1}}$$

between the first input and the output;

$$\frac{(-1)^k (C_{2k-1} + C_{2k} + C_{2k+1})}{s(C_{2k-1} + C_{2k+1}) C_{2k} R}$$

between the second input and the output; and $$-\frac{C_{2k+1}}{C_{2k-1} + C_{2k+1}}$$

between the third input and the output; where:

$$\lambda_k = \frac{C_{2k-1}}{C_{2k-1} + C_{2k} + C_{2k+1}}, \mu_k = \frac{C_{2k+1}}{C_{2k-1} + C_{2k} + C_{2k+1}},$$

s is the LAPLACE operator, and R is an arbitrary constant having the units of resistance.

2. A filter device as in claim 1, and further including a second group of switched-capacitance integrating networks for simulating an analog low-pass ladder filter, said first and second groups collectively simulating an analog band-pass ladder filter comprising a first and a second input terminal, a first and a second output terminal, a plurality of series-connected impedances $Z'_1, \ldots, Z'_{2i-1}, Z'_{2i+1}, \ldots, Z'_{2M-1}$ interconnecting the first input terminal to the first output terminal, a plurality of capacitors . . . $C'_{2i}$ . . . each having one electrode electrically-connected to the second input and output terminals and having its other electrode connected to a point which is electrically common to the impedances $Z'_{2i-1}$, $Z'_{2i+1}$, each of said impedances comprising an inductor $L'_{2i-1}$ in parallel with a capacitor $C'_{2i-1}$;

said second group comprising a first plurality of switched-capacitance networks ($RPB_2$, $RPB_4$ . . . $RPB_{2M}$) having four inputs, and a second plurality of switched-capacitance networks ($RPB_3$, $RPB_5$, . . . $RPB_{2M-1}$) having two inputs, the first input of a network $RPB_{2i+1}$ being connected to the output of the network $RPB_{2i}$, the second input input to the output of the network $RPB_{2i+2}$, the first input of the network $RPB_{2i}$ being connected to the output of the network $RPB_{2i-1}$, the second input to the output of the network $RPB_{2i-2}$, the third input to the output of the network $RPB_{2i+2}$, the fourth input to the output of the network $RPB_{2i+1}$;

said networks $RPB_{2i+1}$ having the following transfer function between the first input and the output, on the one hand and the second input and the output on the other hand:

$$\frac{R'}{sL'_{2i+1}}$$

where $R'$ is an arbitrary constant with the units of a resistance and where s is the LAPLACE operator; and said networks $RPB_{2i}$ having the following transfer functions:

$-1/s \; (C'_{2i-1}+C'_{2i}+C'_{2i+1}) \; R'$ between the first input and the output on the one hand and the fourth input and the output on the other hand;

$$-\frac{C'_{2i-1}}{C'_{2i-1} + C'_{2i} + C'_{2i+1}}$$

between the second input and the output; and $$-\frac{C'_{2i+1}}{C'_{2i-1} + C'_{2i} + C'_{2i+1}}$$

between the third input and the output.

3. A filter device as in claim 1, including a first switched-capacitance input integrating network for simulating an input circuit comprising an input resistor $R_1$ connecting a first terminal for receiving a signal to be filtered to said first input terminal, a second terminal for receiving a signal to be filtered connected to said second input terminal, and further including a switched-capacitance output intergrating network for simulating an output circuit comprising an output resistor $R_2$ interconnecting said output terminals;

said switched-capacitance input integrating network comprising a first input for receiving the signal to be filtered, a second input connected to the output of the network $RB_2$, and a third input and an output, both connected to the first input of the switched-capacitance integrating network $RA_2$ and to the first input of the switched-capacitance integrating network $RB_2$;

said switched-capacitance input integrating network having the following transfer functions:

$$-\frac{1}{sC_1R_1}$$

between its first input and its output;
$-1$ between its second input and its output; and $$-\frac{1}{sC_1R_1}$$

between the third input and its output; and
said switched-capacitance output integrating network comprising a first input connected to the output of the network $RB_{2N}$, and a second input and an output, both connected to the third input to the network $RB_{2N}$ and to the second input of the network $RA_{2N}$, said switched-capacitance output integrating network having the following transfer functions:

$-1$ between its first input and its output; and $$-\frac{1}{sC_{2N+1}R_2}$$

between its second input and its output.

4. A filter device as in claim 2 where said first group is connected to the output of said second group, and where said simulated analog high-pass ladder filter comprises the series capacitances . . . , $C'_{2M+2k-1}$, $C'_{2M+2k+1}$, $C'_{2M+2k+3}$, . . . , $C'_{2M+2N+1}$ interconnecting the first input terminal to the first output terminal, and the admittances . . . $Y'_{2M+2k}$, $Y'_{2M+2k+2}$, . . . connected to the common electrodes of the capacitors, each of said admittances comprising an inductor $L'_{2M+2k}$ in series with a capacitor $C'_{2M+2k}$;

said first group having first inputs of the networks $RA'_{2M+2}$, $RB'_{2M+2}$ connected to the output of the network $RPB_{2M}$ said networks having the transfer functions:

$$-\frac{\lambda_{M+1} \times R}{sL_{2M+2}}$$

between the first input of the network $RA'_{2M+2}$ and its output; and $$-\frac{C_{2M+1}}{C_{2M+1} + C_{2M+3}}$$

between the first input of the network $RB'_{2M+2}$ and its output;

the third input of the network $RPB_{2M}$ being connected to the output of the network $RB'_{2M+2}$, the transfer function between the third input of the network $RPB_{2M}$ and its output being:

$$-\frac{C'_{2M+1}}{C'_{2M-1} + C'_{2M} + C'_{2M+1}}$$

5. A filter device as in claim 4, including a switched-capacitance input integrating network for simulating an input circuit comprising an input resistor $R_{11}$ connecting a terminal for receiving a signal to be filtered to the first input terminal of the analog low-pass ladder filter, and further including a switched-capacitance output integrating network for simulating an output circuit comprising an output resistor $R_{22}$ interconnecting the output terminals of the analog high-pass ladder filter;

said switched-capacitance input integrating network comprising the network $RPB_2$ having a first input for receiving the signal to be filtered, a second input and its output connected to each other, a third input connected to the output of the network $RPB_4$ and a fourth input connected to the output of the network $RPB_3$;

said switched-capacitance input integrating network having the following transfer functions:

$$\frac{1}{s(C_2+C_3)R_{11}}$$

between the first input and its output;

$$-\frac{1}{s(C_2+C_3)R_{11}}$$

between its second input and its output;

$$-\frac{C_3}{C_2+C_3}$$

between its third input and its output; and $$-\frac{1}{s(C_2+C_3)R'}$$

between its fourth input and its output;

said switched-capacitance output integrating network comprising a network RA$'_s$ having a first input connected to the output of the network RB$'_{2M+2N}$ and a second input and an output connected to each other;

said switched-capacitance output integrating network having the following transfer functions:

$-1$ between its first input and its output; and $$-\frac{1}{s(C_{2M+2N+1})R_{22}}$$

between its second input and its output.

* * * * *